United States Patent
Dueck

(10) Patent No.: US 11,512,101 B2
(45) Date of Patent: Nov. 29, 2022

(54) ORGANIC ELECTROLUMINESCENT DEVICES COMPRISING HOST COMPOUNDS

(71) Applicant: SAMSUNG DISPLAY CO., LTD., Yongin-si (KR)

(72) Inventor: Sebastian Dueck, Heidelberg (DE)

(73) Assignee: Samsung Display Co., Ltd., Yongin-si (KR)

( * ) Notice: Subject to any disclaimer, the term of this patent is extended or adjusted under 35 U.S.C. 154(b) by 364 days.

(21) Appl. No.: 16/710,523

(22) Filed: Dec. 11, 2019

(65) Prior Publication Data
US 2020/0190121 A1 Jun. 18, 2020

(30) Foreign Application Priority Data

Dec. 14, 2018 (EP) ..................................... 18212559

(51) Int. Cl.
*C07F 7/08* (2006.01)
*H01L 51/00* (2006.01)

(52) U.S. Cl.
CPC ........ *C07F 7/0812* (2013.01); *H01L 51/0067* (2013.01); *H01L 51/0072* (2013.01); *H01L 51/0094* (2013.01)

(58) Field of Classification Search
CPC ................. C07F 7/0812; C07F 7/0814; H01L 51/0067; H01L 51/0072; H01L 51/0094; H01L 51/50; H01L 51/5024; C09K 2211/1007; C09K 2211/1029; C09K 2211/1044; C09K 2211/1059; C09K 11/06; C09K 2211/1022; H05B 33/14
USPC ........................................................ 428/690
See application file for complete search history.

(56) References Cited

U.S. PATENT DOCUMENTS

| | | | |
|---|---|---|---|
| 2015/0236274 A1 | 8/2015 | Hatakeyama et al. | |
| 2017/0125699 A1* | 5/2017 | Ahn ..................... | H01L 51/0085 |
| 2018/0026202 A1 | 1/2018 | Danz et al. | |
| 2018/0375032 A1* | 12/2018 | Watanabe .............. | C09K 11/06 |

FOREIGN PATENT DOCUMENTS

| | | |
|---|---|---|
| CN | 108409773 A | 8/2018 |
| EP | 3388437 A1 | 10/2018 |
| WO | WO-2014033044 A1 * 3/2014 | .......... C07F 15/0033 |
| WO | WO-2014033050 A1 * 3/2014 | .......... C07F 15/0033 |
| WO | 2015/160224 A1 | 10/2015 |
| WO | 2017/005699 A1 | 1/2017 |

OTHER PUBLICATIONS

Hatakeyama et al., "Ultrapure Blue Thermally Activated Delayed Fluorescence Molecules: Efficient HOMO-LUMO Separation by the Multiple Resonance Effect," Advanced Materials, 2016, 28(14):2777-2781.
Okinaka et al., "New Fluorescent Blue Host Materials for Achieving Low Voltage in OLEDs," Society for Information Display International 30 Symposium Digest of Technical Papers, 2015, 46(1):312-315.

* cited by examiner

*Primary Examiner* — Douglas J Mc Ginty
(74) *Attorney, Agent, or Firm* — Lewis Roca Rothgerber Christie LLP

(57) ABSTRACT

The present invention relates to an organic electroluminescent device comprising a light-emitting layer B containing at least one host compound H of Formula (I)

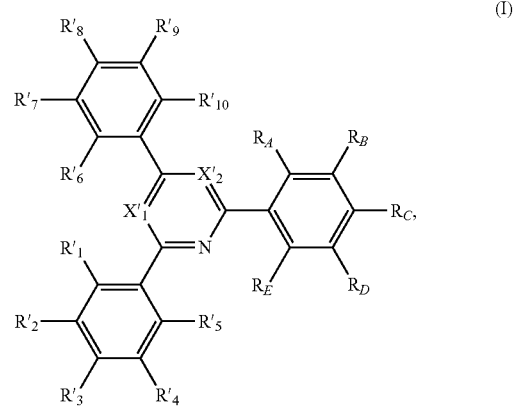

wherein each of $X'_1$ and $X'_2$ is independently from another selected from the group consisting of nitrogen and an optionally substituted carbon atom, and wherein at least one of $R'_1$—$R'_{10}$ is CN and at least one of $R_A$—$R_E$ is a substituted silane residue.

21 Claims, No Drawings

ORGANIC ELECTROLUMINESCENT DEVICES COMPRISING HOST COMPOUNDS

The present invention relates to organic molecules H of Formula (I) and an organic electroluminescent device comprising a light-emitting layer B containing at least one organic compound H of Formula (I) as host.

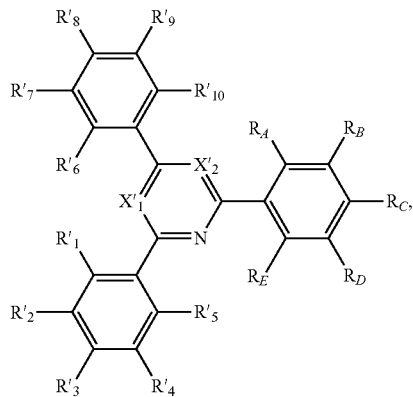

Formula (I)

wherein at least one of $R'_1$, $R'_2$, $R'_3$, $R'_4$, $R'_5$, $R'_6$, $R'_7$, $R'_8$, $R'_9$, and $R'_{10}$ is CN; and at least one of $R_A$, $R_B$, $R_C$, $R_D$ and $R_E$ is a substituted silane residue (—$SiR_K R_M R_N$).

Further, the present invention refers to a method for generating light of a desired wavelength range by means of an organic electroluminescent device according to the present invention to which an electrical current is applied.

Organic electroluminescent devices containing one or more light-emitting layers based on organics such as, e.g., organic light emitting diodes (OLEDs), light emitting electrochemical cells (LECs) and light-emitting transistors gain increasing importance. In particular, OLEDs are promising devices for electronic products such as, e.g., screens, displays and illumination devices. In contrast to most electroluminescent devices essentially based on inorganics, organic electroluminescent devices based on organics are often rather flexible and producible in particularly thin layers.

The OLED-based screens and displays already available today bear particularly beneficial brilliant colors, contrasts and are comparably efficient with respect to their energy consumption.

A central element of an organic electroluminescent device for generating light is a light-emitting layer placed between an anode and a cathode. When a voltage (and current) is applied to an organic electroluminescent device, holes and electrons are injected from an anode and a cathode, respectively, to the light-emitting layer. Excitons of high energy are then generated by recombination of the holes and the electrons. The decay of such excited states (e.g., singlet states such as S1 and/or triplet states such as T1) to the ground state (S0) desirably leads to light emission. In order to enable efficient energy transport and emission, an organic electroluminescent device comprises one or more host compounds and one or more emitter compounds as dopants.

Challenges when generating organic electroluminescent devices are the improvement of the illumination level of the devices (i.e., brightness per current), obtaining a desired light spectrum and achieving suitable lifespans.

In order to improve the illumination level achieved by a device per introduced electric energy, often host compounds are used which can transfer energy to the emitter compounds. In the ideal case of such host-emitter systems, the vast majority excitons are transferred via energy and/or charge transfer from the host compounds to the excited singlet S1 or triplet T1 energy levels of the emitter compounds. Often host compounds further help to spatially separate emitter compounds from another and thereby prevent (self-)quenching. In addition, host compounds may help to improve morphology and/or thermal stability of the emitter layer. A large variety of host compounds is known in the art.

However, many of the host components known in the art bear reactive functional groups that impair the usability, storability and lifespan of the host compounds. Exemplarily, many hosts are particularly sensitive to oxidation. Further, many of the host compounds known in the art require comparably complicated synthesis steps and are thus comparably expensive. Further, it is desired to obtain host compounds that are ambi-polar and/or n-type hosts or ambi-polar and/or electron rich p-type hosts, suitable to provide charge carrier mobility allowing for particularly low driving voltage and/or high brightness.

In the view of the prior art, there is still a need to provide host compounds that are easily obtainable and chemically and thermally stable enabling long lifespans. It is desired that these host compounds bear high triplet energy levels leading to low triplet quenching, and are able to efficiently transfer energy to emitter compounds in the shorter wavelength (deep blue, sky blue or green) range. In particular, there is the need of electron transporting hosts with high triplet energy levels suitable for applications in sky-blue and deep-blue OLEDs.

Surprisingly, it has been found that the organic compound H of the present invention composed of a cyano- and silyl-substituted triphenyl-N-heteroaromatic-ring leads to particularly beneficial properties. The compounds are chemically and thermally stable and allow for long lifespans. The host compound H is chemically well obtainable. The triplet energy T1(H) of the host compound H is rather high as well as the band gap which leads to low triplet quenching. The organic compound H enables low driving voltage and high brightness in the visible range, in particular in the sky-blue and deep-blue range.

In general, an organic compound H of Formula (I) is taught.

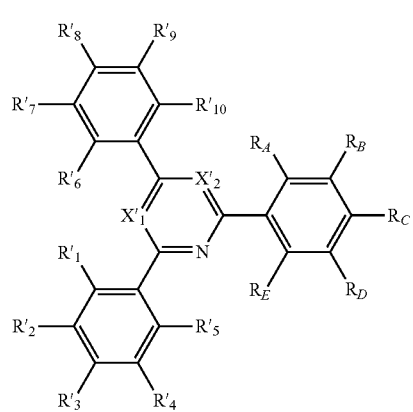

Formula (I)

$X'_1$ is selected from the group consisting of N and $CR^{Tz}$ and $X'_1$ is selected from the group consisting of N and $CR^{Tz}$.

$R^{Tz}$ is at each occurrence independently from another selected from the group consisting of hydrogen, deuterium, CN, $CF_3$, $C_1$-$C_{20}$-alkyl, $C_6$-$C_{18}$-aryl, which may at each occurrence be optionally substituted by a residue selected from the group consisting of $C_1$-$C_{20}$-alkyl, $C_7$-$C_{19}$-alkaryl, and $C_6$-$C_{18}$-aryl; and $C_7$-$C_{19}$-alkaryl, which may at each occurrence be optionally substituted by a residue selected from the group consisting of $C_1$-$C20$-alkyl, $C_7$-$C_{19}$-alkaryl, and $C_6$-$C_{18}$-aryl.

In a preferred embodiment of the invention, at least one of $X'_1$ and $X'_2$ is N. Hence, the N-heteroaromatic-ring is derived from pyrimidine or triazine. In a more preferred embodiment, both of $X'_1$ and $X'_2$ are each N, thus the N-heteroaromatic-ring is derived from triazine.

$R'_1$, $R'_2$, $R'_3$, $R'_4$, $R'_5$, $R'_6$, $R'_7$, $R'_8$, $R'_9$, and $R'_{10}$ is independently from another selected from the group consisting of hydrogen, deuterium, CN, $CF_3$, $C_1$-$C_{20}$-alkyl, $C_6$-$C_{18}$-aryl, which may at each occurrence be optionally substituted by a residue selected from the group consisting of $C_1$-$C_{20}$-alkyl, $C_7$-$C_{19}$-alkaryl, and $C_6$-$C_{18}$-aryl; $C_7$-$C_{19}$-alkaryl, which may at each occurrence be optionally substituted by a residue selected from the group consisting of $C_1$-$C_{20}$-alkyl, $C_7$-$C_{19}$-alkaryl, and $C_6$-$C_{18}$-aryl; and —$SiR_F R_G R_H$.

According to the invention, at least one of $R'_1$, $R'_2$, $R'_3$, $R'_4$, $R'_5$, $R'_6$, $R'_7$, $R'_8$, $R'_9$, and $R'_{10}$ is CN.

In a preferred embodiment of the invention, no more than two of $R'_1$, $R'_2$, $R'_3$, $R'_4$, $R'_5$, $R'_6$, $R'_7$, $R'_8$, $R'_9$, and $R'_{10}$ are CN. Preferably, the other residues are not —$SiR_F R_G R_H$. Preferably, the other residues are each hydrogen (H). In one embodiment, no more than two of $R'_1$, $R'_2$, $R'_3$, $R'_4$, $R'_5$, $R'_6$, $R'_7$, $R'_8$, $R'_9$, and $R'_{10}$ are CN and the other residues are each hydrogen (H).

In a preferred embodiment of the invention, exactly one of $R'_1$, $R'_2$, $R'_3$, $R'_4$, $R'_5$, $R'_6$, $R'_7$, $R'_8$, $R'_9$, and $R'_{10}$, is CN.

In one embodiment of the invention, $R'_1$ is CN and $R'_2$, $R'_3$, $R'_4$, $R'_5$, $R'_6$, $R'_7$, $R'_8$, $R'_9$, and $R'_{10}$ are each a substituent other than CN. In one embodiment, $R'_1$ is CN and $R'_2$, $R'_3$, $R'_4$, $R'_5$, $R'_6$, $R'_7$, $R'_8$, $R'_9$, and $R'_{10}$ are each H.

In a preferred embodiment of the invention, $R'_2$ is CN and $R'_1$, $R'_3$, $R'_4$, $R'_5$, $R'_6$, $R'_7$, $R'_8$, $R'_9$, and $R'_{10}$ are each a substituent other than CN. In a preferred embodiment of the invention, $R'_2$ is CN and $R'_1$, $R'_3$, $R'_4$, $R'_5$, $R'_6$, $R'_7$, R's, $R'_9$, and $R'_{10}$ are each H.

In an alternative embodiment of the invention, $R'_3$ is CN and R'i, $R'_2$, $R'_4$, $R'_5$, $R'_6$, $R'_7$, $R'_8$, $R'_9$, and $R'_{10}$ are each a substituent other than CN. In an embodiment of the invention, $R'_3$ is CN and $R'_1$, $R'_2$, $R'_4$, $R'_5$, $R'_6$, $R'_7$, $R'_8$, $R'_9$, and $R'_{10}$ are each H. In an alternative embodiment of the invention, $R'_1$ is CN and $R'_2$, $R'_3$, $R'_4$, $R'_5$, $R'_6$, $R'_7$, $R'_8$, $R'_9$, and $R'_{10}$ are each a substituent other than CN. In an embodiment of the invention, $R'_1$ is CN and $R'_2$, $R'_3$, $R'_4$, $R'_5$, $R'_6$, $R'_7$, $R'_8$, $R'_9$, and $R'_{10}$ are each H.

In one embodiment of the invention, $R'_3$ is CN and $R'_1$, $R'_2$, $R'_4$, $R'_5$, $R'_6$, $R'_7$, $R'_8$, $R'_9$, and $R'_{10}$ are each a substituent other than CN. In one embodiment of the invention, $R'_3$ is CN and $R'_1$, $R'_2$, $R'_4$, $R'_5$, $R'_6$, $R'_7$, $R'_8$, $R'_9$, and $R'_{10}$ are each H.

Each of $R_F$, $R_G$, and $R_H$ is independently from another selected from the group consisting of unsubstituted or substituted $C_6$-$C_{18}$-aryl, $C_1$-$C_{20}$-alkyl, $C_7$-$C_{19}$-alkaryl, $C_1$-$C_{20}$-heteroalkyl and $C_3$-$C_{17}$-heteroaryl. Preferably, $R_F$, $R_G$, and $R_H$ are the same, more preferably $R_F$, $R_G$, and $R_H$ are each phenyl (Ph).

$R_A$, $R_B$, $R_C$, $R_D$, and $R_E$, is independently from another selected from the group consisting of hydrogen, deuterium, CN, $CF_3$, $C_1$-$C_{20}$-alkyl, $C_6$-$C_{18}$-aryl, which may at each occurrence be optionally substituted by a residue selected from the group consisting of $C_1$-$C_{20}$-alkyl, $C_7$-$C_{19}$-alkaryl, and $C_6$-$C_{18}$-aryl; $C_7$-$C_{19}$-alkaryl, which may at each occurrence be optionally substituted by a residue selected from the group consisting of $C_1$-$C_{20}$-alkyl, $C_7$-$C_{19}$-alkaryl, and $C_6$-$C_{18}$-aryl; and —$SiR_K R_M R_N$.

According to the invention, at least one of $R_A$, $R_B$, $R_C$, $R_D$ and $R_E$ is —$SiR_K R_M R_N$. Preferably, the other residues are not CN.

In a preferred embodiment of the invention, exactly one of $R_A$, $R_B$, $R_C$, $R_D$ and $R_E$ is —$SiR_K R_M R_N$. In a preferred embodiment of the invention, exactly one of $R_A$, $R_B$, $R_C$, $R_D$ and $R_E$ is —$SiR_K R_M R_N$ and the other residues are hydrogen (H).

In one embodiment of the invention, $R_A$ is —$SiR_K R_M R_N$ and $R_B$, $R_C$, $R_D$ and $R_E$ are each a substituent other than —$SiR_K R_M R_N$. In one embodiment of the invention, $R_A$ is —$SiR_K R_M R_N$ and $R_B$, $R_C$, $R_D$ and $R_E$ are each H.

In a preferred embodiment of the invention, $R_B$ is —$SiR_K R_M R_N$ and $R_A$, $R_C$, $R_D$ and $R_E$ are each a substituent other than —$SiR_K R_M R_N$. In a preferred embodiment of the invention, $R_B$ is —$SiR_K R_M R_N$ and $R_A$, $R_C$, $R_D$ and $R_E$ are each H.

In an alternative embodiment of the invention, $R_A$ is —$SiR_K R_M R_N$ and $R_B$, $R_C$, $R_D$ and $R_E$ are each a substituent other than —$SiR_K R_M R_N$. In an embodiment of the invention, $R_A$ is —$SiR_K R_M R_N$ and $R_B$, $R_C$, $R_D$ and $R_E$ are each H. In an alternative embodiment of the invention, $R_C$ is —$SiR_K R_M R_N$ and $R_A$, $R_B$, $R_D$ and $R_E$ are each a substituent other than —$SiR_K R_M R_N$. In an embodiment of the invention, $R_C$ is —$SiR_K R_M R_N$ and $R_A$, $R_B$, $R_D$ and $R_E$ are each H.

In one embodiment of the invention, $R_C$ is —$SiR_K R_M R_N$ and $R_A$, $R_B$, $R_D$ and $R_E$ are each a substituent other than —$SiR_K R_M R_N$. In one embodiment of the invention, $R_C$ is —$SiR_K R_M R_N$ and $R_A$, $R_B$, $R_D$ and $R_E$ are each H.

$R_K$, $R_M$, and $R_N$ are each independently selected from the group consisting of unsubstituted or substituted $C_6$-$C_{18}$-aryl, $C_1$-$C_{20}$-alkyl, $C_7$-$C_{19}$-alkaryl, $C_1$-$C_{20}$-heteroalkyl and $C_3$-$C_{17}$-heteroaryl. Preferably, $R_K$, $R_M$, and $R_N$ are each independently selected from $C_6$-$C_{18}$-aryl and $C_1$-$C_{20}$-alkyl, in particular from phenyl (Ph), methyl (Me), iso-propyl ($^i$Pr), and tert-Butyl ($^t$Bu)

In one embodiment of the invention, $R_K$, $R_M$, and $R_N$ are the same, preferably $R_F$, $R_G$, and $R_H$ are each phenyl (Ph). More preferably, $R_B$ is —$SiR_K R_M R_N$ and $R_A$, $R_C$, $R_D$ and $R_E$ are each a substituent other than —$SiR_K R_M R_N$, and $R_K$, $R_M$, and $R_N$ are the same, in particular each phenyl (Ph).

In a preferred embodiment, the organic compound H has a structure of the following Formula (II):

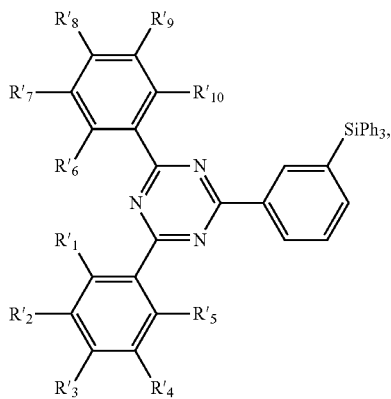

Formula (II)

wherein $R'_1$, $R'_2$, $R'_3$, $R'_4$, $R'_5$, $R'_6$, $R'_7$, $R'_8$, $R'_9$, and $R'_{10}$ are defined as above.

Preferably, the organic compound H of Formula (I) is free of potentially unstable functional groups such as sulfone, phosphine oxides, and fluorine (F) not being part of a $CF_3$ group. In other words, in case F is present in the organic compound H of Formula (I), it typically forms part of a $CH_3$ group.

As used throughout the present application, the terms "aryl" and "aromatic" may be understood in the broadest sense as any mono-, bi- or polycyclic aromatic moieties. If not otherwise indicated, an aryl may also be optionally substituted by one or more substituents which are exemplified further throughout the present application. Accordingly, the term "arylene" refers to a divalent residue that bears two binding sites to other molecular structures and thereby serving as a linker structure. As used throughout the present application, the terms "heteroaryl" and "heteroaromatic" may be understood in the broadest sense as any mono-, bi- or polycyclic heteroaromatic moieties that include at least one heteroatom, in particular which bear from one to three heteroatoms per aromatic ring. Exemplarily, a heteroaromatic compound may be pyrrole, furan, thiophene, imidazole, oxazole, thiazole, triazole, pyrazole, pyridine, pyrazine and pyrimidine, and the like. If not otherwise indicated, a heteroaryl may also be optionally substituted by one or more substituents which are exemplified further throughout the present application. Accordingly, the term "heteroarylene" refers to a divalent residue that bears two binding sites to other molecular structures and thereby serving as a linker structure.

As used throughout the present application, the term "alkyl" may be understood in the broadest sense as both, linear or branched chain alkyl residue. Preferred alkyl residues are those containing from one to fifteen carbon atoms. Exemplarily, an alkyl residue may be methyl, ethyl, propyl, isopropyl, butyl, isobutyl, tert-butyl, and the like. If not otherwise indicated, an alkyl may also be optionally substituted by one or more substituents which are exemplified further throughout the present application. Accordingly, the term "alkylene" refers to a divalent residue that bears two binding sites to other molecular structures and thereby serving as a linker structure.

As used throughout the present application, the term "alkaryl" may be understood in the broadest sense as a residue that comprises a bivalent alkylene residue to which an aryl residue is bound, i.e., an alkylene-aryl residue.

If not otherwise indicated, as used herein, in particular in the context of aryl, arylene, heteroaryl, alkyl and the like, the term "substituted" may be understood in the broadest sense. Preferably, such substitution means a residue selected from the group consisting of $C_1$-$C_{20}$-alkyl, $C_7$-$C_{19}$-alkaryl, and $C_6$-$C_{18}$-aryl. Accordingly, preferably, no charged moiety, more preferably no functional group is present in such substitution.

It will be noticed that hydrogen can, at each occurrence, be replaced by deuterium.

One aspect of the invention relates to the use of the organic compound H as a host and/or hole-blocking layer and/ or electron-transporting material in an organic electroluminescent device. Preferably, the organic compound H is used as a host material in an organic electroluminescent device.

Accordingly a further aspect of the invention relates to an organic electroluminescent device comprising a light-emitting layer B containing at least one organic compound H. In particular, the at least one organic compound H is employed as host.

Accordingly, the invention also refers to the use of an organic compound H according to the present invention as host in a light-emitting layer B of an organic electroluminescent device.

As used herein, the terms organic electroluminescent device and opto-electronic light-emitting devices may be understood in the broadest sense as any device comprising at least one light-emitting layer B containing on one or more organic host compounds and one or more organic emitter compounds. The light-emitting layer B may be mainly composed of both inorganic compounds and organic components. Preferably, the light-emitting layer B is mainly or even completely composed of organic components (including at least one organic compound H of the present invention and typically at least one emitter compound E).

The term "layer" as used in the context of the present invention preferably is a body that bears an extensively planar geometry. The light-emitting layer B preferably bears a thickness of not more than 1 mm, more preferably not more than 0.1 mm, even more preferably not more than 10 µm, even more preferably not more than 1 µm, in particular not more than 0.1 µm.

Unless otherwise specified, any of the layers of the various embodiments may be deposited by any suitable method. The layers in the context of the present invention, including the light-emitting layer B, may optionally be prepared by means of liquid processing (also designated as "film processing", "fluid processing", "solution processing" or "solvent processing").

This means that the components comprised in the respective layer are applied to the surface of a part of a device in liquid state. Preferably, the layers in the context of the present invention, including the light-emitting layer B, may be prepared by means of spin-coating. This method well-known to those skilled in the art allows obtaining thin and (essentially) homogeneous layers.

Alternatively, the layers in the context of the present invention, including the light-emitting layer B, may be prepared by other methods based on liquid processing such as, e.g., casting (e.g., dropcasting) and rolling methods, and printing methods (e.g., inkjet printing, gravure printing, blade coating). This may optionally be carried out in an inert atmosphere (e.g., in a nitrogen atmosphere).

Alternatively, the layers in the context of the present invention, including the light-emitting layer B, may be prepared by any other method known in the art, including but not limited to vacuum processing methods well-known to those skilled in the art such as, e.g., thermal (co-) evaporation, organic vapor phase deposition (OVPD), and deposition by organic vapor jet printing (OVJP).

When preparing layers by means of liquid processing, the solutions including the components of the layers (i.e., with respect to the light-emitting layer B of the present invention, at least one organic compound H and, typically, at least one emitter compound E and optionally one or more other host compounds D) may further comprise a volatile organic solvent. Such volatile organic solvent may optionally be one selected from the group consisting of tetrahydrofuran, dioxane, chlorobenzene, diethylene glycol diethyl ether, 2-(2-ethoxyethoxy)ethanol, gamma-butyrolactone, N-methyl pyrrolidinon, ethoxyethanol, xylene, toluene, anisole, phenetol, acetonitrile, tetrahydrothiophene, benzonitrile, pyridine, trihydrofuran, triarylamine, cyclohexanone, acetone, propylene carbonate, ethyl acetate, benzene and PGMEA (propylen glycol monoethyl ether acetate). Also a combination of two or more solvents may be used. After applied in liquid state, the layer may subsequently be dried and/or hardened by any means of the art, exemplarily at ambient conditions, at increased temperature (e.g., about 50° C. or about 60° C.) or at diminished pressure.

The organic electroluminescent device may be understood in the broadest sense as any device based on organic materials that is suitable for emitting light in the visible or nearest ultraviolet (UV) range, i.e., in the range of a wavelength of from 380 to 800 nm. More preferably, organic electroluminescent device may be able to emit light in the visible range, i.e., of from 400 to 800 nm.

In a preferred embodiment, the organic electroluminescent device is a device selected from the group consisting of an organic light emitting diode (OLED), a light emitting electrochemical cell (LEC, also designate as organic light emitting electrochemical cell), and a light-emitting transistor (also designate as organic light-emitting transistor).

Particularly preferably, the organic electroluminescent device is an organic light emitting diode (OLED). Optionally, the OLED may be a phosphorescent organic light-emitting diode (PHOLED). Optionally, the OLED may include hyperfluorescence. Optionally, the organic electroluminescent device as a whole may be intransparent, semi-transparent or (essentially) transparent.

The components may be comprised in various amounts. Preferably, the light-emitting layer B comprises 5-99% by weight, preferably 10-75% by weight, in particular 15-50% by weight, of at least one organic compound H according to the present invention.

Preferably, the light-emitting layer B further comprises 1-50% by weight, preferably 5-40% by weight, in particular 10-30% by weight, of at least one emitter compound E.

Optionally, the light-emitting layer B may comprise up to 94% by weight, preferably 20-90% by weight, in particular 40-80% by weight, of one or more further host compounds D (D$^1$, D$^2$, D$^3$, . . . ), i.e., at least one further host compound D (D$^1$), not according to Formula (I).

Optionally, the light-emitting layer B may comprise up to 94% by weight, preferably not more than 65% by weight, more preferably not more than 50% by weight, more preferably not more than 20% by weight, of a solvent, in particular no solvent.

In a preferred embodiment, the light-emitting layer B comprises (or (essentially) consists of):
(i) 5-99% by weight, preferably 10-75% by weight, in particular 15-50% by weight, of at least one organic compound H according to the present invention;
(ii) 1-50% by weight, preferably 5-40% by weight, in particular 10-30% by weight, of at least one emitter compound E; and optionally
(iii) 0-94% by weight, preferably 19.9-84.9% by weight, in particular 39-74% by weight, of at least one further host compound D not according to Formula (I); and optionally
(iv) 0-10% by weight, preferably 0.1-7% by weight, in particular 1-5% by weight, of at least one further emitter compound F not according to Formula (I); and optionally
(v) 0-94% by weight, preferably 0-65% by weight, in particular 0-50% by weight, of a solvent.

Accordingly, preferably, the light-emitting layer B comprises (or (essentially) consists of):
(i) 5-99% by weight of at least one organic compound H according to the present invention;
(ii) 1-50% by weight of at least one emitter compound E; and optionally
(iii) 0-94% by weight of at least one further host compound D not according to Formula (I); and optionally
(iv) 0-10% by weight of at least one further emitter compound F not according to Formula (I); and optionally
(v) 0-94% by weight of a solvent.

More preferably, the light-emitting layer B comprises (or (essentially) consists of):
(i) 10-75% by weight of at least one organic compound H according to the present invention;
(ii) 5-40% by weight of at least one emitter compound E; and optionally
(iii) 20-90% by weight of at least one further host compound D not according to Formula (I); and optionally
(iv) 0.1-7% by weight of at least one further emitter compound F not according to Formula (I); and optionally
(v) 0-65% by weight of a solvent.

Even more preferably, the light-emitting layer B comprises (or (essentially) consists of):
(i) 15-50% by weight of at least one organic compound H according to the present invention;
(ii) 10-30% by weight of at least one emitter compound E; and optionally
(iii) 40-80% by weight of at least one further host compound D not according to Formula (I); and optionally
(iv) 1-5% by weight of at least one further emitter compound F not according to Formula (I); and optionally
(v) 0-6 0% by weight of a solvent.

The at least one further emitter compound F, may exemplarily be selected from a fluorescence emitter or the near-range charge transfer (NRCT) emitter compound $E^{NRCT}$ as described below.

In a preferred embodiment, the light-emitting layer B comprises (or (essentially) consists of):
(i) 5-99% by weight, preferably 10-75% by weight, in particular 15-50% by weight, of at least one host compound H according to the present invention;
(ii) 0.1-10% by weight, preferably 0.5-5% by weight, in particular 1-3% by weight, of at least one NRCT emitter compound $E^{NRCT}$; and (iiia) 0.9-94.9% by weight, preferably 24.5-85% by weight, in particular 47-75% by weight, of at least one further host compound D not according to Formula (I);
(iv) 0-94% by weight, preferably 0-65% by weight, in particular 0-50% by weight, of a solvent.

In an alternative preferred embodiment, the light-emitting layer B comprises (or (essentially) consists of):
(i) 5-99% by weight, preferably 10-75% by weight, in particular 15-50% by weight, of at least one host compound H according to a the present invention;
(ii) 0.1-10% by weight, preferably 0.5-5% by weight, in particular 1-3% by weight, of at least one NRCT emitter compound $E^{NRCT}$; and
(iiib) 0.9-94.9% by weight, preferably 24.5-85% by weight, in particular 47-75% by weight, of at least one TADF compound $E^{TADF}$ not according to Formula (I); and optionally
(iv) 0-94% by weight, preferably 0-65% by weight, in particular 0-50% by weight, of a solvent.

In this embodiment, the at least one TADF compound $E^{TADF}$ may act as host as well as emitter. Preferably, the combination of at least one NRCT emitter compound $E^{NRCT}$ and the at least one TADF compound $E^{TADF}$ is chosen in a way that energy transfer from $E^{TADF}$ to $E^{NRCT}$ is sufficient enough that emission essentially only occurs from $E^{NRCT}$.

In order to improve the flow properties, in addition, one or more additives S may optionally be added. Exemplarily, such an additives may be selected from the group consisting of polyethyloxides (polyethylene glycols), polyethylene diamines, polyacrylates (e.g., poly(methyl methacrylate) (PMMA), polyacrylic acid and salts thereof (superabsorber)), substituted or unsubstituted polystyrenes (e.g., polyhydroxystyrene), polyvinylalcohols, Polyesters or polyurethanes, polyvinylcarbazoles, polytriarylamines, polythiophenes and poly(vinylidene phenylenes). Also a combination of two or more additives may be used.

In order to modify the emission spectrum and/or the absorption spectrum of the light-emitting layer B further, the light-emitting layer B may further comprise one or more dyes. Such dye may be any dye known in the art. The dye may optionally be a fluorescent and/or phosphorescent dye which is able to shift the emission spectrum and/or the absorption spectrum of the light-emitting layer B. Optionally, it may also provoke two-photon effects (i.e., the absorption of two photons of half the energy of the absorption maximum). Optionally, the light-emitting layer B may also comprise fluorescent polymers (e.g., superyellow (SY)), photoluminescent nanoparticles (e.g., of silicium), quantum dots, cadmium selenide and/or exciplexes, optionally diluted with one or more host components.

In particular when it is intended for a light-emitting electrochemical cell (LEC), the light-emiting layer may comprise an ionic fluid or a combination of two or more ionic liquids. Exemplarily, such ionic fluid may be such selected from the group consisting of: methylimidazolium hexafluorophosphates (e.g., 1-alkyl-3-methylimidazolium hexafluorophosphate such as 1-methyl-3-methylimidazolium hexafluorophosphat, 1-ethyl-3-methylimidazolium hexafluorophosphate, 1-propyl-3-methylimidazolium hexafluorophosphate, 1-butyl-3-methylimidazolium hexafluorophosphate, 1-benzyl-3-methylimidazolinium hexafluorophosphate), dimethylimidazolium hexafluorophosphates (e.g., 1-alkyl-2,3-dimethylimidazolium hexafluorophosphate such as 1-butyl-2,3-dimethylimidazolium hexafluorophosphate), 3-methylimidazolium hexafluorophosphates (e.g., 1-alkyl-methylimidazolium hexafluorophosphates such as 1-methyl-3-methylimidazolium hexafluorophosphate, 1-ethyl-3-methylimidazolium hexafluorophosphate, 1-propyl-3-methylimidazolium hexafluorophosphate, 1-butyl-3-methylimidazolium hexafluorophosphate, 1-pentyl-3-methylimidazolium hexafluorophosphate, 1-hexyl-3-methylimidazolium-hexafluorophosphate), 1-butyl-1-(3,3,4,4,5,5,6,6,7,7,8,8-tridecafluorooctyl)imidazolium hexafluorophosphate, 1-methyl-3-(3,3,4,4,5,5,6,6,7,7,8,8,8-tridecafluorooctyl) imidazolium hexafluorophosphate, 1-methyl-3-octylimidazolium hexafluorophosphate, methylimidazolium tetrafluoroborates (e.g., 1,3-dimethylimidazolium tetrafluoroborate, 1-ethyl-3-methyl-imidazolium tetrafluoroborate, 1-propyl-3-methylimidazolium tetrafluoroborate, 1-butyl-3-methylimidazolium tetrafluoroborate), 1-butyl-2,3-dimethylimidazolium tetrafluoroborate, 1-hexyl-3-methylimidazolium tetrafluoroborate, 1-methyl-3-octyl-imidazolium tetrafluoroborate, methylimidazolium trifluoromethanesulfonates (e.g., 1-methyl-3-methylimidazolium trifluoromethanesulfonate, 1-ethyl-3-methylimidazolium trifluoromethanesulfonate, 1-propyl-3-methylimidazolium trifluoromethanesulfonate, 1-butyl-3-methylimidazolium trifluoromethanesulfonate), 1,2,3-trimethylimidazolium trifluoromethanesulfonate, 1-ethyl-3-methylimidazolium bis(pentafluoroethylsulfonyl)imide, 1-butyl-3-methylimidazolium bis(trifluoromethylsulfonyl)imide, 1-butyl-3-methylimidazolium methanesulfonate, tetrabutylammonium bis-trifluoromethane sulfonimidate, tetrabutylammonium methane sulfonate, tetrabutylammonium nonafluorobutane sulfonate, tetrabutylammonium heptadecafluorooctane sulfonate, tetrahexylammonium tetrafluoroborate, tetrabutylammonium trifluoromethanesulfonate, tetrabutylammoniumbenzoate, tetrabutylammonium halogenide (e.g., tetrabutylammoniumchloride, tetrabutylammoniumbromide), 1-benzyl-3-methylimidazolium tetrafluoroborate, trihexyl-tetradecylphosphonium hexafluorophosphate, tetrabutylphosphonium methanesulfonate, tetrabutyl-phosphonium tetrafluoroborate, tetrabutyl-phosphoniumbromide, 1-butyl-3-methylpyridinium-bis(trifluormethylsulfonyl)imide, 1-butyl-4-methylpyridinium hexafluorophosphate, 1-butyl-4-methylpyridinium tetrafluoroborate, sodium tetraphenylborate, tetrabutylammonium tetraphenylborate, sodiumtetrakis(1-imidazolyl)borate and cesium tetraphenylborate.

Alternatively or additionally, the light-emitting layer B may comprise one or more of the following compounds selected from the group consisting of an aromatic compound (e.g., benzene, biphenyl, triphenyl, triphenylene, naphthalene, anthracene, phenalene, phenanthrene, fluorene, pyrene, chrysene, perylene, azulene), an heteroaromatic compound (e.g., dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, selenophenodipyridine), and a combination of two or more thereof.

In a preferred embodiment, the organic electroluminescent device comprises at least one layer adjacent to the emission layer B which comprises the organic compound H. Preferably, the at least one layer adjacent to the emission layer B comprising the organic compound H is located between cathode and the emission layer B, more preferably between the electron transport layer and the and the emission layer B. In particular, the at least one layer adjacent to the emission layer B comprising the organic compound H is the hole-blocking layer.

The organic compound H and/or the emitter compound E may optionally also be used to transport or inject charges and thereby helps to transport charges within the light-emitting layer B.

Preferably, the light-emitting layer B concomitant to light-emission has an additional functionality selected from the group consisting of serving as an electron transport layer, a hole blocking layer, a hole transport layer, an electron blocking layer, and an exciton blocking layer.

As used herein, a solvent may be composed of one, two or more dissolving agents, typically liquids. These can in principle be organic or inorganic liquids, preferably, organic liquids.

Exemplarily, organic compound H disclosed herein may be used as host in conjunction with a wide variety of emitter compounds E, transport layers, blocking layers, injection layers, electrodes and other layers that may be present. The materials described herein are merely non-limiting examples of materials that may be useful in combination with the compounds and components disclosed herein, and those skilled in the art are readily able to consult the literature to identify other materials that may be useful in combination herewith.

As far as present, the ratio between the organic compound H and the emitter compound E may be any H:E ratio such as, e.g., in the range of from 99:1 to 1:99, preferably in the range of from 70:30 to 30:70.

In principle, the emitter compound E may be any emitter compound known in the art. The term "emitter compound" may be understood in the broadest sense as any optically active compound that is, depending on certain conditions, able to emit light when introduced into the light-emitting layer B in the organic electroluminescent device of the present invention. Accordingly, an emitter compound E may indeed be used to generate light. When subjected to an electrical current flow in a suitable strength, the emitter compound E is excited to form an exciton (i.e., an excited state such as S1(E) or T1(E) and optionally also a higher energy level such as, e.g., S2(E) etc.) The exciton may then relax into the ground energy level corresponding to the respective non-excited state S0(E) by concomitantly emitting light.

The energy of the exciton may optionally also be transferred into other excited states, even of further emitter compounds and/or dyes.

Preferably, it is such that energy can be transferred from the organic compound H as host to the emitter compound E, in particular transferred from the first excited triplet state T1(H) of the organic compound H to the first excited triplet state T1(E) of the emitter compound E and/or from the first excited singlet state S1(H) of the host compound H to the first excited singlet state S1(E) of the emitter compound E.

In a preferred embodiment, at least one emitter compound E is a thermally activated delayed fluorescence (TADF) emitter compound $E^{TADF}$.

As used herein, the terms "TADF material" and "TADF emitter" may be understood interchangeably. When one of the terms "emitter" "emitter compound" or the like is used, this may be understood in that preferably a TADF material of the present invention is meant, in particular one designated as $E^{TADF}$.

According to the present invention, a TADF material is characterized in that it exhibits a $\Delta E_{ST}$ value, which corresponds to the energy difference between the lowermost excited singlet state (S1) and the lowermost excited triplet state (T1), of less than 0.4 eV, preferably less than 0.3 eV, more preferably less than 0.2 eV, even more preferably less than 0.1 eV or even less than 0.05 eV.

Accordingly in an embodiment of the present invention, the TADF material $E^{TADF}$ is characterized in that it has a $\Delta E_{ST}$ value, which corresponds to the energy difference between $S1^E$ and $T1^E$, of less than 0.4 eV. In a preferred embodiment of the present invention, the TADF material $E^{TADF}$ is characterized in that it has a $\Delta E_{ST}$ value of less than 0.3 eV, less than 0.2 eV, less than 0.1 eV, or even less than 0.05 eV.

In a preferred embodiment, the emitter compound E is a metal-free thermally activated delayed fluorescence (TADF) emitter having a first excited triplet state T1(E) energetically lower than the first excited triplet state T1(H) of the host compound H and a first excited singlet state S1(E) energetically lower than the first excited singlet state S1(H) of the host compound H.

In a preferred embodiment, the organic electroluminescent device comprises at least one further host compound D.

Preferably, the energy level of the lowest unoccupied molecule orbital LUMO(H) of organic compound H is lower in energy than that of at least one further host compounds D (herein designated as $D^1$, which can optionally also be the only further host component.).

Preferably, the host organic compound H lowest unoccupied molecule orbital LUMO(H) having an energy $E^{LUMO}$(H).

Preferably, the at least one further host compound D ($D^1$) has a lowest unoccupied molecule orbital LUMO(D) having an energy $E^{LUMO}$(D), wherein $E^{LUMO}$(H)<$E^{LUMO}$(D).

In a preferred embodiment, the organic electroluminescent device comprises at least one further host compound D, wherein the organic compound H has a lowest unoccupied molecule orbital LUMO(H) having an energy $E^{LUMO}$(H) and the at least one further host compound D has a lowest unoccupied molecule orbital LUMO(D) having an energy $E^{LUMO}$(D), wherein $E^{LUMO}$(H)<$E^{LUMO}$(D).

Exemplarily, the further host compound D is selected from CBP (4,4'-Bis-(N-carbazolyl)-biphenyl), mCP, mCBP, Sif87 (dibenzo[b,d]thiophen-2-yltriphenylsilane), CzSi, SimCP ([3,5-Di(9H-carbazol-9-yl)phenyl]triphenylsilane), Sif88 (dibenzo[b,d]thiophen-2-yl)diphenylsilane), DPEPO (bis[2-(diphenylphosphino)phenyl]ether oxide), 9-[3-(dibenzofuran-2-yl)phenyl]-9H-carbazole, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole, bis(2-dibenzothiophenyl)phenyl]-9H-carbazole, T2T (2,4,6-tris(biphenyl-3-yl)-1,3,5-triazine), T3T (2,4,6-tris(triphenyl-3-yl)-1,3,5-triazine) and/or TST (2,4,6-tris(9,9'-spirobifluorene-2-yl)-1,3,5-triazine). The host material typically should be selected to exhibit first triplet (T1) and first singlet (S1) energy levels, which are energetically higher than the first triplet (T1) and first singlet (S1) energy levels of the emitter. Preferably the further host compound D is selected from CBP, mCP, mCBP, 9-[3-(dibenzofuran-2-yl)phenyl]-9H-carbazole, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole and 9-[3,5-bis(2-dibenzothiophenyl)phenyl]-9H-carbazole as hole-dominant host.

The person skilled in the art will notice that the light-emitting layer B will typically be incorporated in the organic electroluminescent device of the present invention. Preferably, such organic electroluminescent device comprises at least the following layers: at least one light-emitting layer B, at least one anode layer A and at least one cathode layer C.

Preferably, the anode layer A contains at least one component selected from the group consisting of indium tin oxide, indium zinc oxide, PbO, SnO, graphite, doped silicium, doped germanium, doped GaAs, doped polyaniline, doped polypyrrole, doped polythiophene, and mixtures of two or more thereof.

Preferably, the cathode layer C contains at least one component selected from the group consisting of Al, Au, Ag, Pt, Cu, Zn, Ni, Fe, Pb, In, W, Pd, LiF, Ca, Ba, Mg, and mixtures or alloys of two or more thereof.

Preferably, the light-emitting layer B is located between an anode layer A and a cathode layer C. Accordingly, the general set-up is preferably A—B—C. This does of course not exclude the presence of one or more optional further layers. These can be present at each side of A, of B and/or of C.

In a preferred embodiment, the organic electroluminescent device comprises at least the following layers:
A) an anode layer A containing at least one component selected from the group consisting of indium tin oxide, indium zinc oxide, PbO, SnO, graphite, doped silicium, doped germanium, doped GaAs, doped polyaniline, doped polypyrrole, doped polythiophene, and mixtures of two or more thereof;
B) the light-emitting layer B; and
C) a cathode layer C containing at least one component selected from the group consisting of Al, Au, Ag, Pt, Cu, Zn, Ni, Fe, Pb, In, W, Pd, LiF, Ca, Ba, Mg, and mixtures or alloys of two or more thereof,
wherein the light-emitting layer B is located between the anode layer A and the a cathode layer C.

In one embodiment, when the organic electroluminescent device is an OLED, it may optionally comprise the following layer structure:
A) an anode layer A, exemplarily comprising indium tin oxide (ITO);
HTL) a hole transport layer HTL;
B) a light-emitting layer B according to present invention as described herein;
ETL) an electron transport layer ETL; and
C) a cathode layer, exemplarily comprising Al, Ca and/or Mg.

Preferably, the order of the layers herein is A—HTL—B—ETL—C.

Furthermore, the organic electroluminescent device may optionally comprise one or more protective layers protecting the device from damaging exposure to harmful species in the environment including, exemplarily moisture, vapor and/or gases.

Preferably, the anode layer A is located on the surface of a substrate. The substrate may be formed by any material or composition of materials. Most frequently, glass slides are used as substrates. Alternatively, thin metal layers (e.g., copper, gold, silver or aluminum films) or plastic films or slides may be used.

This may allow a higher degree of flexibility. The anode layer A is mostly composed of materials allowing to obtain an (essentially) transparent film. As at least one of both electrodes should be (essentially) transparent in order to allow light emission from the OLED, either the anode layer A or the cathode layer C transparent. Preferably, the anode layer A comprises a large content or even consists of transparent conductive oxides (TCOs).

Such anode layer A may exemplarily comprise indium tin oxide, aluminum zinc oxide, fluor tin oxide, indium zinc oxide, PbO, SnO, zirconium oxide, molybdenum oxide, vanadium oxide, wolfram oxide, graphite, doped Si, doped Ge, doped GaAs, doped polyaniline, doped polypyrrol and/or doped polythiophene.

Particularly preferably, the anode layer A (essentially) consists of indium tin oxide (ITO) (e.g., $(InO_3)_{0.9}(SnO_2)_{0.1}$). The roughness of the anode layer A caused by the transparent conductive oxides (TCOs) may be compensated by using a hole injection layer (HIL). Further, the HIL may facilitate the injection of quasi charge carriers (i.e., holes) in that the transport of the quasi charge carriers from the TCO to the hole transport layer (HTL) is facilitated. The hole injection layer (HIL) may comprise poly-3,4-ethylendioxy thiophene (PEDOT), polystyrene sulfonate (PSS), $MoO_2$, $V_2O_5$, CuPC or CuI, in particular a mixture of PEDOT and PSS. The hole injection layer (HIL) may also prevent the diffusion of metals from the anode layer A into the hole transport layer (HTL).

The HIL may exemplarily comprise PEDOT:PSS (poly-3,4-ethylendioxy thiophene: polystyrene sulfonate), PEDOT (poly-3,4-ethylendioxy thiophene), mMTDATA (4,4',4''-tris[phenyl(m-tolyl)amino]triphenylamine), Spiro-TAD (2,2',7,7'-tetrakis(n,n-diphenylamino)-9,9'-spirobifluorene), DNTPD (N1,N1'-(biphenyl-4,4'-diyl)bis(N1-phenyl-N4,N4-di-m-tolylbenzene-1,4-diamine), NPB (N,N'-nis-(1-naphthalenyl)-N,N'-bis-phenyl-(1,1'-biphenyl)-4,4'-diamine), NPNPB (N,N'-diphenyl-N,N'-di-[4-(N,N-diphenylamino)phenyl]benzidine), MeO-TPD (N,N,N',N'-tetrakis(4-methoxyphenyl)-benzi-dine), HAT-CN (1,4,5,8,9,11-hexaazatriphenylen-hexacarbonitrile) and/or Spiro-NPD (N,N'-diphenyl-N,N'-bis-(1-naphthyl)-9,9'-spirobifluorene-2,7-diamine).

Adjacent to the anode layer A or hole injection layer (HIL) typically a hole transport layer (HTL) is located. Herein, any hole transport compound may be used. Exemplarily, electron-rich heteroaromatic compounds such as triarylamines and/or carbazoles may be used as hole transport compound. The HTL may decrease the energy barrier between the anode layer A and the light-emitting layer B (serving as emitting layer (EML)). The hole transport layer (HTL) may also be an electron blocking layer (EBL). Preferably, hole transport compounds bear comparably high energy levels of their triplet states T1. Exemplarily the hole transport layer (HTL) may comprise a star-shaped heterocycle such as tris(4-carbazoyl-9-ylphenyl)amine (TCTA), poly-TPD (poly(4-butylphenyl-diphenyl-amine)), [alpha]-NPD (poly(4-butylphenyl-diphenyl-amine)), TAPC (4,4'-cyclohexyliden-bis[N,N-bis(4-methylphenyl)benzenamine]), 2-TNATA (4,4',4''-tris[2-naphthyl(phenyl)-amino]triphenylamine), Spiro-TAD, DNTPD, NPB, NPNPB, MeO-TPD, HAT-CN and/or TrisPcz (9,9'-diphenyl-6-(9-phenyl-9H-carbazol-3-yl)-9H,9'H-3,3'-bicarbazole). In addition, the HTL may comprise a p-doped layer, which may be composed of an inorganic or organic dopant in an organic hole-transporting matrix. Transition metal oxides such as vanadium oxide, molybdenum oxide or tungsten oxide may exemplarily be used as inorganic dopant. Tetrafluorotetracyanoquinodimethane (F4-TCNQ), copper-pentafluorobenzoate (Cu(I)pFBz) or transition metal complexes may exemplarily be used as organic dopant.

The EBL may exemplarily comprise mCP (1,3-bis(carbazol-9-yl)benzene), TCTA, 2-TNATA, mCBP (3,3-di(9H-carbazol-9-yl)biphenyl), 9-[3-(dibenzofuran-2-yl)phenyl]-9H-carbazole, 9-[3-(dibenzofuran-2-yl)phenyl]-9H-carbazole, 9-[3-(dibenzothiophen-2-yl)phenyl]-9H-carbazole, 9-[3,5- bis(2-dibenzofuranyl)phenyl]-9H-carbazole, 9-[3,5-bis(2-dibenzothiophenyl)phenyl]-9H-carbazole, tris-Pcz, CzSi (9-(4-tert-butylphenyl)-3,6-bis(triphenylsilyl)-9H-carbazole), 3',5'-di-(N-carbazolyl)-[1,1'-biphenyl]-2-carbonitrile (DCPBN; CAS 1918991-70-4), 3-(N-carbazolyl)-N-phenyl-carbazole (NCNPC) and/or DCB (N,N'-dicarbazolyl-1,4-dimethylbenzene).

In the electron transport layer (ETL), any electron transporter may be used. Exemplarily, compounds poor of electrons such as, e.g., benzimidazoles, pyridines, triazoles, oxadiazoles (e.g., 1,3,4-oxadiazole), phosphinoxides and sulfone, may be used. Exemplarily, an electron transporter ETM may also be a star-shaped heterocycle such as 1,3,5-tri(1-phenyl-1H-benzo[d]imidazol-2-yl)phenyl (TPBi). The ETM may exemplarily be NBphen (2,9-bis(naphthalen-2-yl)-4,7-diphenyl-1,10-phenanthroline), Alq3 (Aluminum-tris(8-hydroxyquinoline)), TSPO1 (diphenyl-4-triphenylsilylphenyl-phosphinoxide), BPyTP2 (2,7-di(2,2'-bipyridin-5-yl)triphenyle), Sif87 (dibenzo[b,d]thiophen-2-yltriphenylsilane), Sif88 (dibenzo[b,d]thiophen-2-yl) diphenylsilane), BmPyPhB (1,3-bis[3,5-di(pyridin-3-yl)phenyl]benzene) and/or BTB (4,4'-bis-[2-(4,6-diphenyl-1,3,5-triazinyl)]-1,1-biphenyl). Optionally, the electron transport layer may be doped with materials such as Liq (8-hydroxyquinolinolatolithium). Optionally, a second electron transport layer may be located between electron transport layer and the cathode layer C. The electron transport layer (ETL) may also block holes or a hole-blocking layer (HBL) is introduced.

The HBL may, for example, comprise BCP (2,9-dimethyl-4,7-diphenyl-1,10-phenanthroline=Bathocuproine), BAlq (bis(8-hydroxy-2-methylquinoline)-(4-phenylphenoxy)aluminum), NBphen (2,9-bis(naphthalen-2-yl)-4,7-diphenyl-1,10-phenanthroline), Alq3 (Aluminum-tris(8-hydroxyquinoline)), TSPO1 (diphenyl-4-triphenylsilylphenyl-phosphinoxide), T2T (2,4,6-tris(biphenyl-3-yl)-1,3,5-triazine), T3T (2,4,6-tris(triphenyl-3-yl)-1,3,5-triazine), TST (2,4,6-tris(9,9'-spirobifluorene-2-yl)-1,3,5-triazine), DTST (2,4-diphenyl-6-(3'-triphenylsilylphenyl)-1,3,5-triazine), DTDBF (2,8-bis(4,6-diphenyl-1,3,5-triazinyl)dibenzofurane) and/or TCB/TCP (1,3,5-tris(N-carbazolyl)benzol/1,3,5-tris(carbazol)-9-yl) benzene).

Adjacent to the electron transport layer (ETL), a cathode layer C may be located. Exemplarily, the cathode layer C may comprise or may consist of a metal (e.g., Al, Au, Ag, Pt, Cu, Zn, Ni, Fe, Pb, LiF, Ca, Ba, Mg, In, W, or Pd) or a metal alloy. For practical reasons, the cathode layer C may also consist of (essentially) intransparent metals such as Mg, Ca or Al.

Alternatively or additionally, the cathode layer C may also comprise graphite and or carbon nanotubes (CNTs). Alternatively, the cathode layer C may also consist of nanoscale silver wires.

An OLED may further, optionally, comprise a protection layer between the electron transport layer (ETL) D and the cathode layer C (which may be designated as electron injection layer (EIL)). This layer may comprise lithium fluoride, caesium fluoride, silver, Liq (8-hydroxyquinolinolatolithium), $Li_2O$, $BaF_2$, MgO and/or NaF.

As used herein, if not defined more specifically in a particular context, the designation of the colors of emitted and/or absorbed light is as follows:
violet: wavelength range of >380-420 nm;
deep blue: wavelength range of >420-475 nm;
sky blue: wavelength range of >475-500 nm;
green: wavelength range of >500-560 nm;
yellow: wavelength range of >560-580 nm;
orange: wavelength range of >580-620 nm;
red: wavelength range of >620-800 nm.

With respect to emitter compounds, such colors refer to the emission maximum $\zeta_{max}^{PMMA}$ of a poly(methyl methacrylate) (PMMA) film with 10% by weight of the emitter, for NRCT emitters with 1% by weight respectively. Therefore, exemplarily, a deep blue emitter has an emission maximum $\lambda_{max}^{PMMA}$ in the range of from 420 to 475 nm, a sky blue emitter has an emission maximum $\lambda_{max}^{PMMA}$ in the range of from 475 to 500 nm, a green emitter has an emission maximum $\lambda_{max}^{PMMA}$ in a range of from 500 to 560 nm, a red emitter has an emission maximum $\lambda_{max}^{PMMA}$ in a range of from 620 to 800 nm.

A deep blue emitter may preferably have an emission maximum $\lambda_{max}^{PMMA}$ of not more than 475 nm, more preferably below 470 nm, even more preferably below 465 nm or even below 460 nm. It will typically be above 420 nm, preferably above 430 nm, more preferably of at least 440 nm. In a preferred embodiment, the device exhibits an emission maximum $\lambda_{max}(D)$ of 420 to 475 nm, 430 to 470 nm, 440 to 465 nm, or 450 to 460 nm. In a preferred embodiment, the device exhibits an emission maximum $\lambda_{max}(D)$ of 440 to 475 nm. In a preferred embodiment, the device exhibits an emission maximum $\lambda_{max}(D)$ of 450 to 470 nm.

Accordingly, a further embodiment of the present invention relates to an OLED, which exhibits an external quantum efficiency at 1000 cd/m² of more than 10%, more preferably of more than 13%, more preferably of more than 15%, even more preferably of more than 18% or even more than 20% and/or exhibits an emission maximum between 420 nm and 500 nm, preferably between 430 nm and 490 nm, more preferably between 440 nm and 480 nm, even more preferably between 450 nm and 470 nm and/or exhibits a LT80 value at 500 cd/m² of more than 100 h, preferably more than 200 h, more preferably more than 400 h, even more preferably more than 750 h or even more than 1000 h.

A further embodiment of the present invention relates to an OLED, which emits light at a distinct color point. According to the present invention, the OLED emits light with a narrow emission band (small full width at half maximum (FWHM)). In a preferred embodiment, the OLED according to the invention emits light with a FWHM of the main emission peak of below 0.30 eV, more preferably of below 0.25 eV, even more preferably of below 0.20 eV or even below 0.18 eV.

A further aspect of the present invention relates to an OLED, which emits light with CIEx and CIEy color coordinates close to the CIEx (=0.131) and CIEy (=0.046) color coordinates of the primary color blue (CIEx=0.131 and CIEy=0.046) as defined by ITU-R Recommendation BT.2020 (Rec. 2020) and thus is suited for the use in Ultra High Definition (UHD) displays, e.g. UHD-TVs. In commercial applications, typically top-emitting (top-electrode is transparent) devices are used, whereas test devices as used throughout the present application represent bottom-emitting devices (bottom-electrode and substrate are transparent). The CIEy color coordinate of a blue device can be reduced by up to a factor of two, when changing from a bottom- to a top-emitting device, while the CIEx remains nearly unchanged (Okinaka et al., Society for Information Display International Symposium Digest of Technical Papers, 2015, 46(1):312-313,DOI:10.1002/sdtp.10480). Accordingly, a further aspect of the present invention relates to an OLED, whose emission exhibits a CIEx color coordinate of between 0.02 and 0.30, preferably between 0.03 and 0.25, more preferably between 0.05 and 0.20 or even more preferably between 0.08 and 0.18 or even between 0.10 and 0.15 and/ or a ClEy color coordinate of between 0.00 and 0.45, preferably between 0.01 and 0.30, more preferably between 0.02 and 0.20 or even more preferably between 0.03 and 0.15 or even between 0.04 and 0.10.

Orbital and excited state energies can be determined by means of experimental methods known to the person skilled in the art. Experimentally, the energy of the highest occupied molecular orbital $E^{HOMO}$ is determined by methods known to the person skilled in the art from cyclic voltammetry measurements with an accuracy of 0.1 eV. The energy of the lowest unoccupied molecular orbital $E^{LUMO}$ is calculated as $E^{HOMO}+E^{gap}$, where $E^{gap}$ is determined as follows:

For host compounds, the onset of emission of a film with 10% by weight of host in poly(methyl methacrylate) (PMMA), which corresponds to the energy of the first excited singlet state S1, is used as $E^{gap}$, unless stated otherwise. For emitter compounds, $E^{gap}$ and thus the energy of the first excited singlet state S1 is determined in the same way, unless stated otherwise. For host compounds, the energy of the first excited triplet state T1 is determined from the onset of the time-gated emission spectrum at 77 K, typically with a delay time of 1 ms and an integration time of 1 ms, if not otherwise stated measured in a film of poly(methyl methacrylate) (PMMA) with 10% by weight of host. For TADF emitter compounds, the energy of the first excited triplet state T1 is determined from the onset of the time-gated emission spectrum at 77 K, typically with a delay time of 1 ms and an integration time of 1 ms in a PMMA film with 10% by weight of TADF emitter compounds. For NRCT emitter compounds, S1 and T1 are determined analogously to TADF emitter compounds, but in a PMMA film with 1% by weight of NRCT emitter.

TADF compound $E^{TADF}$

In a preferred embodiment, the TADF emitter compound $E^{TADF}$ consists of a structure according to Formula (Is):

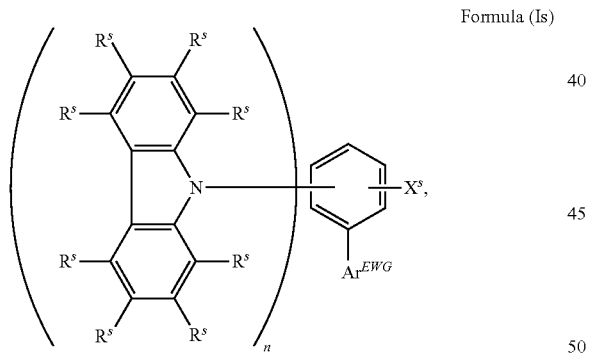

Formula (Is)

n is at each occurrence independently from another 1 or 2.

$X^s$ is at each occurrence independently from another selected SiPh$_3$, CN or CF$_3$.

$Ar^{EWG}$ is at each occurrence independently from another a structure according to one of Formulas IIsa to IIsm:

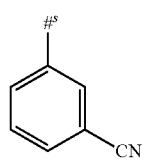

Formula IIsa

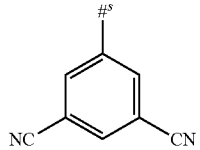

Formula IIsb

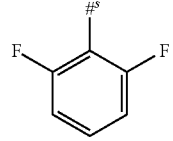

Formula IIsc

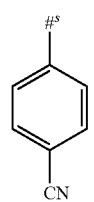

Formula IIsd

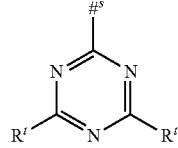

Formula IIse

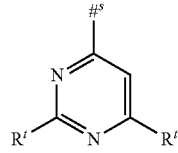

Formula IIsf

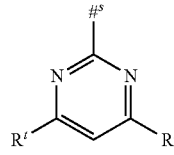

Formula IIs

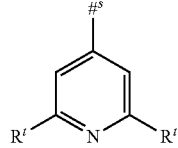

Formula IIsh

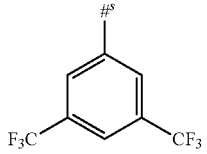

Formula IIsi

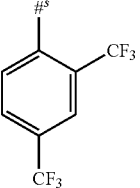

Formula IIsj

-continued

Formula IIsk

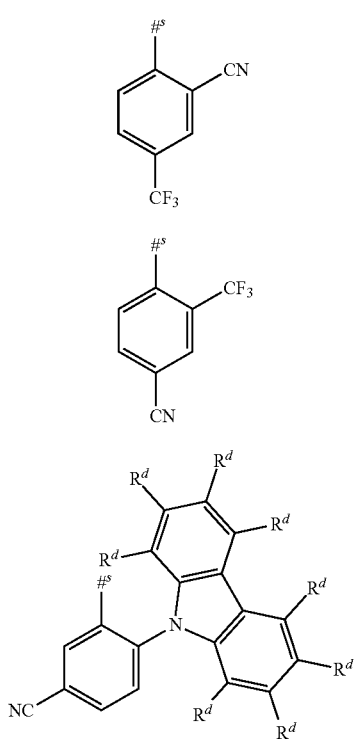

Formula IIsl

Formula IIsm wherein #$^s$ represents the binding site of the single bond linking Ar$^{EWG}$ to the substituted central phenyl ring of Formula 1s.

R$^t$ is at each occurrence independently from another selected from the group consisting of hydrogen, deuterium, C$_1$-C$_5$-alkyl, wherein one or more hydrogen atoms are optionally substituted by deuterium, and C$_6$-C$_{18}$-aryl, which is optionally substituted with one or more substituents R$^{6s}$.

R$^s$ is at each occurrence independently from another selected from the group consisting of hydrogen, deuterium, N(R$^{5s}$)$_2$, OR$^{5s}$,
  SR$^{5s}$, Si(R$^{5s}$)$_3$, CF$_3$, CN, F,
  C$_1$-C$_{40}$-alkyl which is optionally substituted with one or more substituents R$^{5s}$ and wherein one or more non-adjacent CH$_2$-groups are optionally substituted by R$^{5s}$C=CR$^{5s}$, C≡C, Si(R$^{5s}$)$_2$, Ge(R$^{5s}$)$_2$, Sn(R$^{5s}$)$_2$, C=O, C=S, C=Se, C=NR$^{5s}$, P(=O)(R$^{5s}$), SO, SO$_2$, NR$^{5s}$, O, S or CONR$^{5s}$;
  C$_1$-C$_{40}$-thioalkoxy which is optionally substituted with one or more substituents R$^{5s}$ and wherein one or more non-adjacent CH$_2$-groups are optionally substituted by R$^{5s}$C=CR$^{5s}$, C≡C, Si(R$^{5s}$)$_2$, Ge(R$^{5s}$)$_2$, Sn(R$^{5s}$)$_2$, C=O, C=S, C=Se, C=NR$^{5s}$, P(=O)(R$^{5s}$), SO, SO$_2$, NR$^{5s}$, O, S or CONR$^{5s}$; and
  C$_6$-C$_{60}$-aryl which is optionally substituted with one or more substituents R$^{5s}$;
  C$_3$-C$_{57}$-heteroaryl which is optionally substituted with one or more substituents R$^{5s}$.

R$^{5s}$ is at each occurrence independently from another selected from the group consisting of hydrogen, deuterium, N(R$^{6s}$)$_2$, OR$^{6s}$, SR$^{6s}$, Si(R$^{6s}$)$_3$, CF$_3$, CN, F,
  C$_1$-C$_{40}$-alkyl which is optionally substituted with one or more substituents R$^{6s}$ and wherein one or more non-adjacent CH$_2$-groups are optionally substituted by R$^{6s}$C=CR$^{6s}$, C≡C, Si(R$^{6s}$)$_2$, Ge(R$^{6s}$)$_2$, Sn(R$^{6s}$)$_2$, C=O, C=S, C=Se, C=NR$^{6s}$, P(=O)(R$^{6s}$), SO, SO$_2$, NR$^{6s}$, O, S or CONR$^{6s}$;

C$_6$-C$_{60}$-aryl which is optionally substituted with one or more substituents R$^{6s}$; and
  C$_3$-C$_{57}$-heteroaryl which is optionally substituted with one or more substituents R$^{6s}$.

R$^{6s}$ is at each occurrence independently from another selected from the group consisting of hydrogen, deuterium, OPh, CF$_3$, CN, F,
  C$_1$-C$_5$-alkyl, wherein one or more hydrogen atoms are optionally, independently from each other substituted by deuterium, CN, CF$_3$, or F;
  C$_1$-C$_5$-alkoxy,
  wherein one or more hydrogen atoms are optionally, independently from each other substituted by deuterium, CN, CF$_3$, or F;
  C$_1$-C$_5$-thioalkoxy, wherein one or more hydrogen atoms are optionally, independently from each other substituted by deuterium, CN, CF$_3$, or F;
  C$_6$-C$_{18}$-aryl which is optionally substituted with one or more C$_1$-C$_5$-alkyl substituents;
  C$_3$-C$_{17}$-heteroaryl which is optionally substituted with one or more C$_1$-C$_5$-alkyl substituents;
  N(C$_6$-C$_{18}$-aryl)$_2$;
  N(C$_3$-C$_{17}$-heteroaryl)$_2$, and
  N(C$_3$-C$_{17}$-heteroaryl)(C$_6$-C$_{18}$-aryl).

R$^d$ is at each occurrence independently from another selected from the group consisting of hydrogen, deuterium, N(R$^{5s}$)$_2$, OR$^{5s}$,
  SR$^{5s}$, Si(R$^{5s}$)$_3$, CF$_3$, CN, F,
  C$_1$-C$_{40}$-alkyl which is optionally substituted with one or more substituents R$^{5s}$ and wherein one or more non-adjacent CH$_2$-groups are optionally substituted by R$^{5s}$C=CR$^{5s}$, C≡C, Si(R$^{5s}$)$_2$, Ge(R$^{5s}$)$_2$, Sn(R$^{5s}$)$_2$, C=O, C=S, C=Se, C=NR$^{5s}$, P(=O)(R$^{5s}$), SO, SO$_2$, NR$^{5s}$, O, S or CONR$^{5s}$;
  C$_1$-C$_{40}$-thioalkoxy which is optionally substituted with one or more substituents R$^{5s}$ and wherein one or more non-adjacent CH$_2$-groups are optionally substituted by R$^{5s}$C=CR$^{5s}$, C≡C, Si(R$^{5s}$)$_2$, Ge(R$^{5s}$)$_2$, Sn(R$^{5s}$)$_2$, C=O, C=S, C=Se, C=NR$^{5s}$, P(=O)(R$^{5s}$), SO, SO$_2$, NR$^{5s}$, O, S or CONR$^{5s}$; and
  C$_6$-C$_{60}$-aryl which is optionally substituted with one or more substituents R$^{5s}$;
  C$_3$-C$_{57}$-heteroaryl which is optionally substituted with one or more substituents R$^{5s}$.

According to the invention, the substituents R$^5$ or R$^{5s}$ may independently from each other optionally form a mono- or polycyclic, (hetero)aliphatic, (hetero)aromatic and/or benzo-fused ring system with one or more substituents Rs or R$^{5s}$.

According to the invention, the one or more substituents R$^d$ independently from each other optionally may form a mono- or polycyclic, (hetero)aliphatic, (hetero)aromatic and/or benzo-fused ring system with one or more substituents R$^d$.

In one embodiment of the invention, n=2.
In one embodiment of the invention, X$^s$ is CN.
In a preferred embodiment, n=2 and X$^s$ is CN.
In one embodiment of the invention, R$^s$ is at each occurrence independently from another selected from the group consisting of hydrogen, deuterium, Me, $^i$Pr, tBu, CN, CF$_3$, Ph, which is optionally substituted with one or more substituents independently from each other selected from the group consisting of Me, $^i$Pr, $^t$Bu, CN, CF$_3$ and Ph;
pyridinyl, which is optionally substituted with one or more substituents independently from each other selected from the group consisting of Me, $^i$Pr, $^t$Bu, CN, CF$_3$ and Ph;

pyrimidinyl, which is optionally substituted with one or more substituents independently from each other selected from the group consisting of Me, $^iPr$, $^tBu$, CN, $CF_3$ and Ph;

carbazolyl, which is optionally substituted with one or more substituents independently from each other selected from the group consisting of Me, $^iPr$, $^tBu$, CN, $CF_3$ and Ph;

triazinyl, which is optionally substituted with one or more substituents independently from each other selected from the group consisting of Me, $^iPr$, $^tBu$, CN, $CF_3$ and Ph; and $N(Ph)_2$.

In one embodiment of the invention, $R^d$ is at each occurrence independently from another selected from the group consisting of hydrogen, deuterium, Me, $^iPr$, $^tBu$, CN, $CF_3$, Ph, which is optionally substituted with one or more substituents independently from each other selected from the group consisting of Me, $^iPr$, $^tBu$, CN, $CF_3$ and Ph;

pyridinyl, which is optionally substituted with one or more substituents independently from each other selected from the group consisting of Me, $^iPr$, $^tBu$, CN, $CF_3$ and Ph;

pyrimidinyl, which is optionally substituted with one or more substituents independently from each other selected from the group consisting of Me, $^iPr$, $^tBu$, CN, $CF_3$ and Ph;

carbazolyl, which is optionally substituted with one or more substituents independently from each other selected from the group consisting of Me, $^iPr$, $^tBu$, CN, $CF_3$ and Ph;

triazinyl, which is optionally substituted with one or more substituents independently from each other selected from the group consisting of Me, $^iPr$, $^tBu$, CN, $CF_3$ and Ph; and $N(Ph)_2$.

In one embodiment of the invention, the TADF emitter compound $E^{TADF}$ is chosen from molecules of a structure of Formula IIIs:

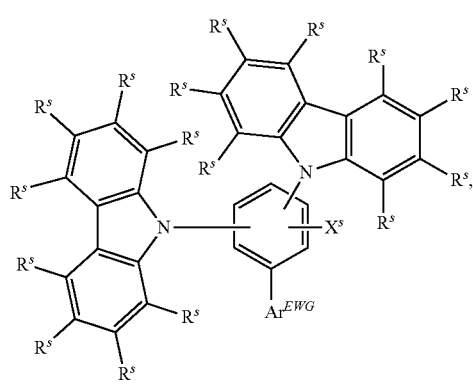

(Formula IIIs)

wherein $R^s$, $Ar^{EWG}$ and $X^s$ are defined as above.

In one embodiment of the invention, the TADF emitter compound $E^{TADF}$ is chosen from molecules of a structure of Formula III as:

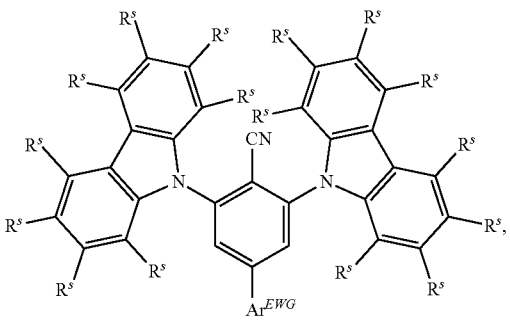

(Formula IIIas)

wherein $R^s$ and $Ar^{EWG}$ are defined as above.

In one embodiment of the invention, the TADF emitter compound $E^{TADF}$ is chosen from molecules of a structure of Formula IIIaas:

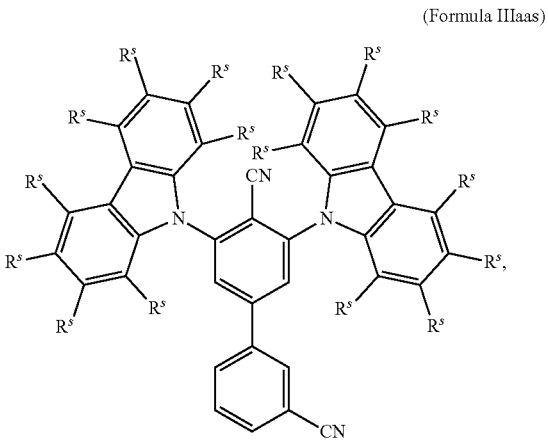

(Formula IIIaas)

wherein $R^s$ is defined as above.

In one embodiment of the invention, the TADF emitter compound $E^{TADF}$ is chosen from molecules of a structure of Formula IIIabs:

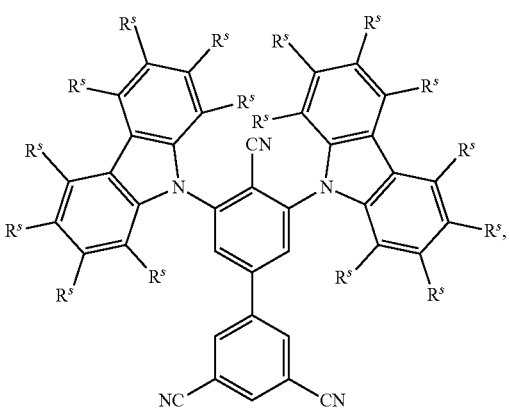

(Formula IIIabs)

wherein $R^s$ is defined as above.

In one embodiment of the invention, the TADF emitter compound $E^{TADF}$ is chosen from molecules of a structure of Formula IIIacs:

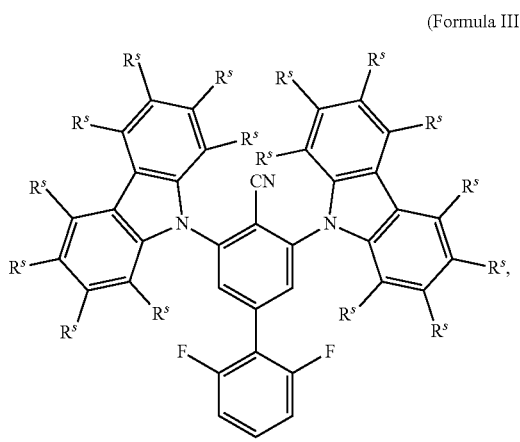

(Formula IIIacs)

wherein $R^s$ is defined as above.

In one embodiment of the invention, the TADF emitter compound $E^{TADF}$ is chosen from molecules of a structure of Formula IIIaes:

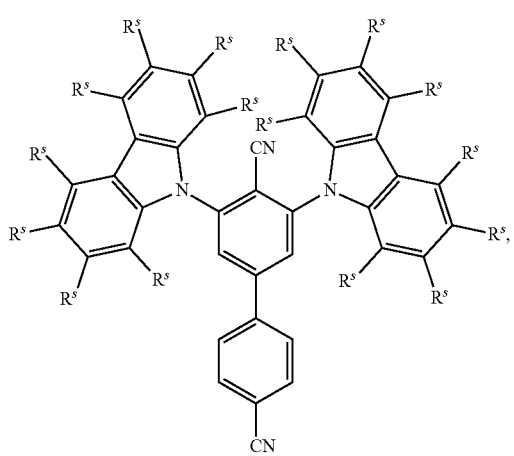

(Formula IIIaes)

wherein $R^s$ is defined as above.

In one embodiment of the invention, the TADF emitter compound $E^{TADF}$ is chosen from molecules of a structure of Formula IIIafs:

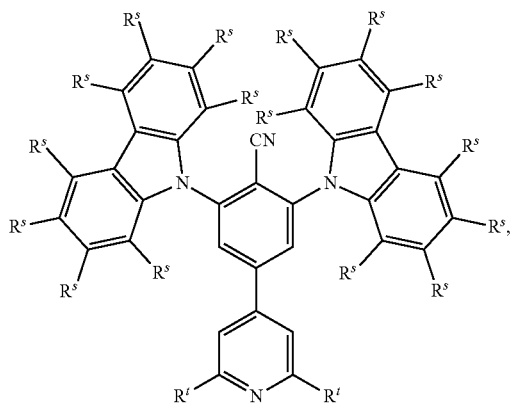

(Formula IIIafs)

wherein $R^s$ is defined as above.

In one embodiment of the invention the TADF emitter compound $E^{TADF}$ is chosen from molecules of a structure of Formula IIIags:

(Formula IIIags)

wherein $R^s$ is defined as above.

In one embodiment of the invention, the TADF emitter compound $E^{TADF}$ is chosen from molecules of a structure of Formula IIIahs:

(Formula IIIahs)

wherein $R^s$ is defined as above.

In one embodiment of the invention, the TADF emitter compound $E^{TADF}$ is chosen from molecules of a structure of Formula IIIais:

(Formula IIIais)

wherein $R^s$ is defined as above.

In one embodiment of the invention, the TADF emitter compound $E^{TADF}$ is chosen from molecules of a structure of Formula IIIaks:

(Formula IIIaks)

wherein $R^s$ is defined as above.

In one embodiment of the invention, the TADF emitter compound $E^{TADF}$ is chosen from molecules of a structure of Formula IVs:

(Formula IVs)

each of $Q^{III}$ and $Q^{IV}$ is independently from each other selected from N and $CR^{Ty}$;

$R^{Ty}$ is at each occurrence independently from another selected from the group consisting of hydrogen, deuterium, CN, $CF_3$, $C_1$-$C_{20}$-alkyl, $C_6$-$C_{18}$-aryl, and $C_7$-$C_{19}$-alkaryl and, wherein $C_6$-$C_{18}$-aryl or $C_7$-$C_{19}$-alkaryl can at each occurrence be optionally substituted by a residue selected from the group consisting of $C_1$-$C_{20}$-alkyl, $C_7$-$C_{19}$-alkaryl, and $C_6$-$C_{18}$-aryl; and wherein $R^s$, $X^s$, and $R^t$ are defined as above.

In one embodiment, $R^{Ty}$ is at each occurrence independently from another selected from the group consisting of hydrogen, deuterium, methyl, tert-butyl and phenyl. In one embodiment, $R^{Ty}$ is hydrogen at each occurrence.

In one embodiment of the invention, the TADF emitter compound $E^{TADF}$ I chosen from molecules of a structure of Formula IVas:

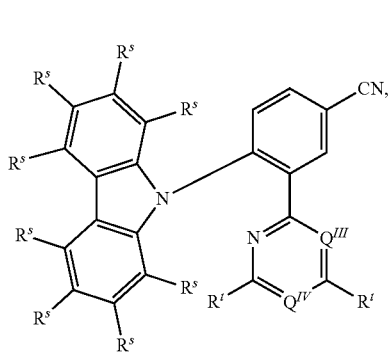

(Formula IVas)

wherein $R^s$, $Q^{III}$, $Q^{IV}$ and $R^t$ are defined as above.

In one embodiment of the invention, the TADF emitter compound $E^{TADF}$ is chosen from molecules of a structure of Formula IVaas:

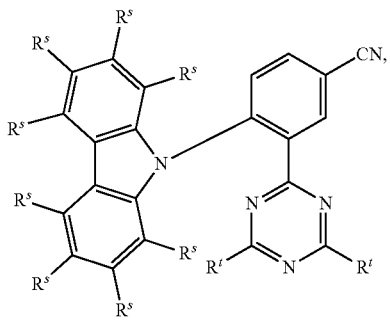

(Formula IVaas)

wherein $R^s$ and $R^t$ are defined as above.

In one embodiment of the invention, the TADF emitter compound $E^{TADF}$ is chosen from molecules of a structure of Formula IVabs:

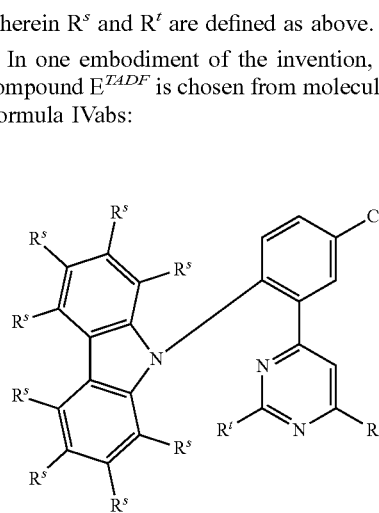

(Formula IVabs)

wherein $R^s$ and $R^t$ are defined as above.

In one embodiment of the invention, the TADF emitter compound $E^{TADF}$ is chosen from molecules of a structure of Formula IVacs:

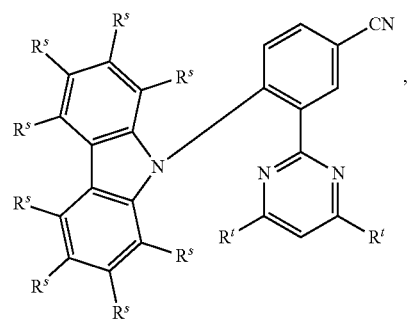

(Formula IVacs)

wherein $R^s$ and $R^t$ are defined as above.

In one embodiment of the invention, the TADF emitter compound $E^{TADF}$ is chosen from molecules of a structure of Formula Vs:

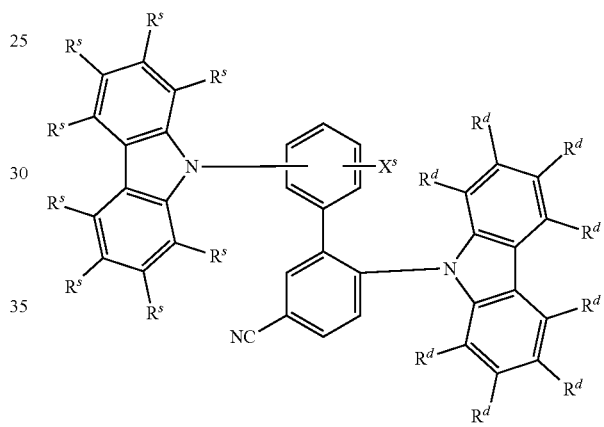

(Formula Vs)

wherein $R^s$, $X^s$, and $R^d$ are defined as above.

In one embodiment of the invention, the TADF emitter compound $E^{TADF}$ is chosen from molecules of a structure of Formula Vas:

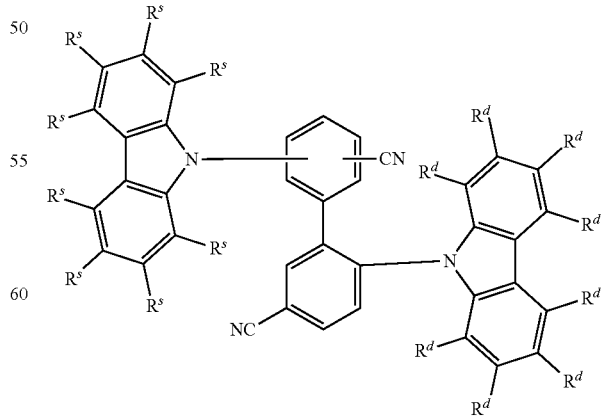

(Formula Vas)

wherein $R^s$ and $R^d$, are defined as above.

In one embodiment of the invention, the TADF emitter compound E$^{TADF}$ is chosen from molecules of a structure of Formula Vaas:

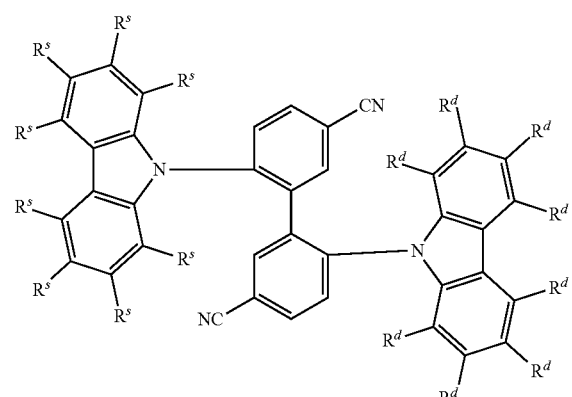

(Formula Vaas)

wherein R$^s$ and R$^d$ are defined as above.

In one embodiment of the invention, the TADF emitter compound E$^{TADF}$ is chosen from molecules of a structure of Formula Vabs:

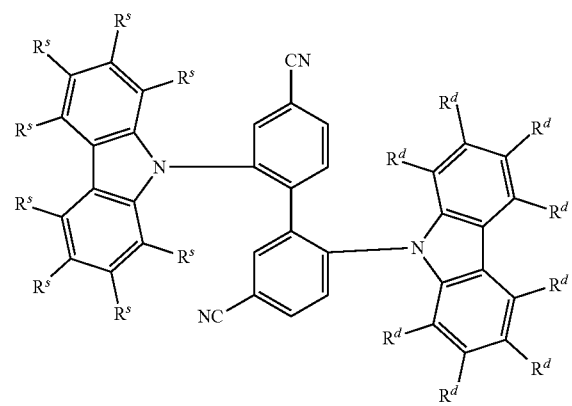

(Formula Vabs)

wherein R$^s$ and R$^d$ are defined as above.

In one embodiment of the invention, the TADF emitter compound E$^{TADF}$ chosen from molecules of a structure of Formula VIas:

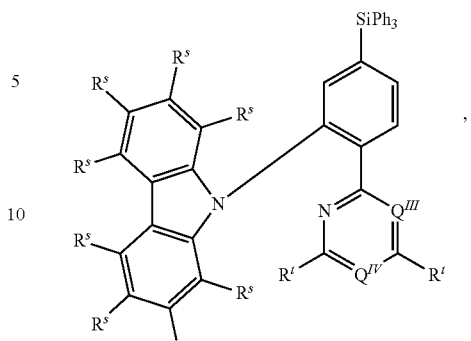

(Formula VIas)

wherein R$^s$, Q$^{III}$, Q$^{IV}$ and R$^t$ are defined as above.

In one embodiment of the invention, the TADF emitter compound E$^{TADF}$ is chosen from molecules of a structure of Formula VIaas:

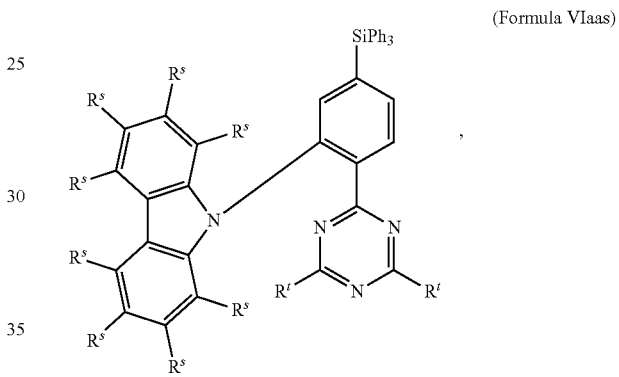

(Formula VIaas)

wherein R$^s$ and R$^t$ are defined as above.

The synthesis of the molecules of a structure of Formula (Is) can be accomplished via standard reactions and reaction conditions known to the skilled artesian. Typically, in a first step a coupling reaction, preferably a palladium catalyzed coupling reaction, is performed.

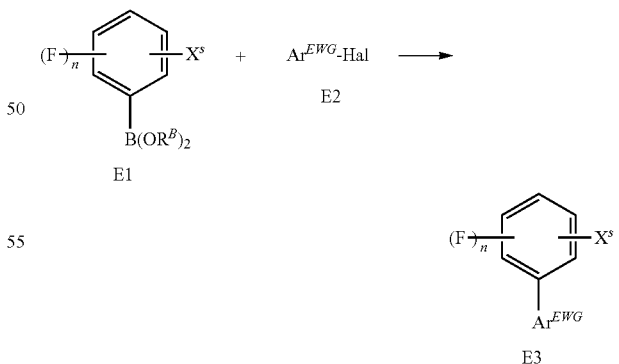

E1 can be any boronic acid (R$^B$=H) or an equivalent boronic acid ester (R$^B$=alkyl or aryl), in particular two R$_B$ form a ring to give e.g. boronic acid pinacol esters, of fluoro-(trifluoromethyl)phenyl, difluoro-(trifluoromethyl)phenyl, fluoro-(cyano)phenyl or difluoro-(cyano)phenyl. As second reactant E2 preferably Ar$^{EWG}$—Br is used. Reaction conditions of such palladium catalyzed coupling reactions are known the person skilled in the art, e.g. from WO 2017/005699, and it is known that the reacting groups of E1 and E2 can be interchanged to optimize the reaction yields.

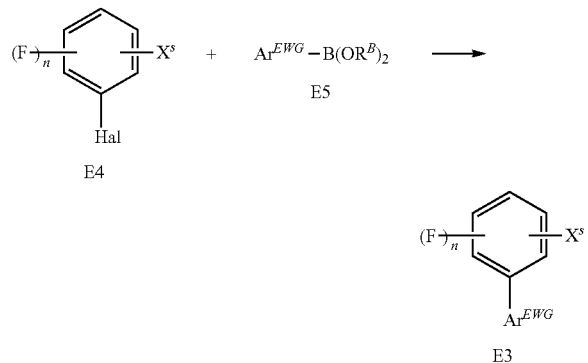

In a second step, the molecules according to Formula 1s are obtained via the reaction of a nitrogen heterocycle in a nucleophilic aromatic substitution with the aryl halide, preferably aryl fluoride, or aryl dihalide, preferably aryl difluoride, E3. Typical conditions include the use of a base, such as tribasic potassium phosphate or sodium hydride, for example, in an aprotic polar solvent, such as dimethyl sulfoxide (DMSO) or N,N-dimethylformamide (DMF), for example.

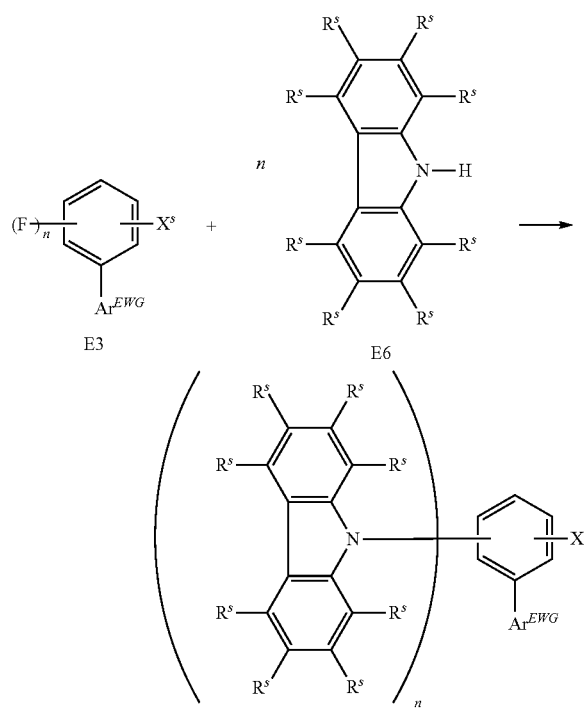

In particular, the donor molecule E6 is a 3,6-substituted carbazole (e.g., 3,6-dimethylcarbazole, 3,6 diphenylcarbazole, 3,6-di-tert-butylcarbazole), a 2,7-substituted carbazole (e.g., 2,7 dimethylcarbazole, 2,7-diphenylcarbazole, 2,7-di-tert-butylcarbazole), a 1,8-substituted carbazole (e.g., 1,8-dimethylcarbazole, 1,8-diphenylcarbazole, 1,8-di-tert-butyl-carbazole), a 1 substituted carbazole (e.g., 1-methylcarbazole, 1-phenylcarbazole, 1-tert-butylcarbazole), a 2 substituted carbazole (e.g., 2-methylcarbazole, 2-phenylcarbazole, 2-tert-butylcarbazole), or a 3 substituted carbazole (e.g., 3-methylcarbazole, 3-phenylcarbazole, 3-tert-butylcarbazole).

Alternatively, a halogen-substituted carbazole, particularly 3-bromocarbazole, can be used as E6.

In a subsequent reaction a boronic acid ester functional group or boronic acid functional group may be exemplarily introduced at the position of the one or more halogen substituents, which was introduced via E6, to yield the corresponding carbazol-3-ylboronic acid ester or carbazol-3-ylboronic acid, e.g., via the reaction with bis(pinacolato)diboron (CAS No. 73183-34-3). Subsequently, one or more substituents $R^s$ may be introduced in place of the boronic acid ester group or the boronic acid group via a coupling reaction with the corresponding halogenated reactant $R^s$-Hal, preferably $R^s$—Cl and $R^s$—Br.

Alternatively, one or more substituents $R^s$ may be introduced at the position of the one or more halogen substituents, which was introduced via D-H, via the reaction with a boronic acid of the substituent $R^s$ [$R^s$—B(OH)$_2$] or a corresponding boronic acid ester.

An alternative synthesis route comprises the introduction of a nitrogen heterocycle via copper-or palladium-catalyzed coupling to an aryl halide or aryl pseudohalide, preferably an aryl bromide, an aryl iodide, aryl triflate or an aryl tosylate.

NRCT emitter compound $E^{NRCT}$

According to the invention, a NRCT emitter shows a delayed component in the time-resolved photoluminescence spectrum and exhibits a near-range HOMO-LUMO separation as described by Hatakeyama et al. (Advanced Materials, 2016, 28(14):2777-2781,DOI: 10.1002/adma.201505491). In some embodiments, the NRCT emitter is a TADF material.

In a preferred embodiment, the NRCT emitter compound $E^{NRCT}$ comprises or consists of a polycyclic aromatic compound according to Formula (1) or (2) or a specific example described in US-A 2015/236274. US-A 2015/236274 also describes examples for synthesis of such compounds. In a preffered embodiment, the NRCT emitter is a blue boron containing NRCT emitter.

In one embodiment, the NRCT emitter compound $E^{NRCT}$ comprises or consists of a structure according to Formula (In):

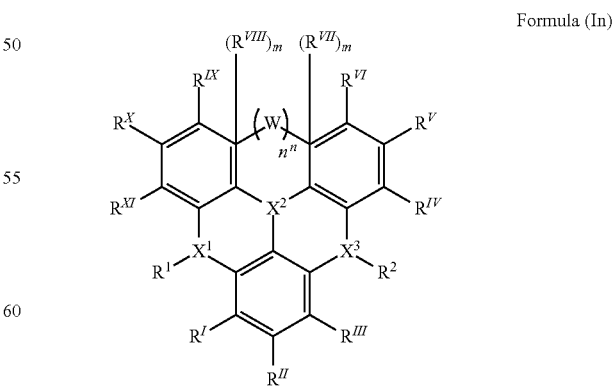

Formula (In)

wherein
$n''$ is 0 or 1, m =1−n.
$X^1$ is N or B.

$X^2$ is N or B.

$X^3$ is N or B.

W is selected from the group consisting of $Si(R^3)_2$, $C(R^3)_2$ and $BR^3$.

each of $R^1$, $R^2$ and $R^3$ is independently from each other selected from the group consisting of:

$C_1$-$C_5$-alkyl, which is optionally substituted with one or more substituents $R^6$;

$C_6$-$C_{60}$-aryl, which is optionally substituted with one or more substituents $R^6$; and $C_3$-$C_{57}$-heteroaryl, which is optionally substituted with one or more substituents $R^6$;

each of $R^I$, $R^{II}$, $R^{III}$, $R^{IV}$, $R^V$, $R^{VI}$, $R^{VII}$, $R^{VIII}$, $R^{IX}$, $R^X$, and $R^{XI}$ is independently from another selected from the group consisting of: hydrogen, deuterium, $N(R^5)_2$, $OR^5$, $Si(R^5)_3$, $B(OR^5)_2$, $OSO_2R^5$, $CF_3$, CN, halogen, $C_1$-$C_{40}$-alkyl, which is optionally substituted with one or more substituents $R^5$ and wherein one or more non-adjacent $CH_2$-groups are each optionally substituted by $R^5C=CR^5$, $C≡C$, $Si(R^5)_2$, $Ge(R^5)_2$, $Sn(R^5)_2$, $C=O$, $C=S$, $C=Se$, $C=NR^5$, $P(=O)(R^5)$, SO, $SO_2$, $NR_5$, O, S or $CONR^5$;

$C_1$-$C_{40}$-alkoxy, which is optionally substituted with one or more substituents $R^5$ and wherein one or more non-adjacent $CH_2$-groups are each optionally substituted by $R^5C=CR^5$, $C≡C$, $Si(R^5)_2$, $Ge(R^5)_2$, $Sn(R^5)_2$, $C=O$, $C=S$, $C=Se$, $C=NR^5$, $P(=O)(R^5)$, SO, $SO_2$, $NR^5$, O, S or $CONR^5$;

$C_1$-$C_{40}$-thioalkoxy, which is optionally substituted with one or more substituents $R^5$ and wherein one or more non-adjacent $CH_2$-groups are each optionally substituted by $R^5C=CR^5$, $C≡C$, $Si(R^5)_2$, $Ge(R^5)_2$, $Sn(R^5)_2$, $C=O$, $C=S$, $C=Se$, $C=NR^5$, $P(=O)(R^5)$, SO, $SO_2$, $NR^5$, O, S or $CONR^5$;

$C_2$-$C_{40}$-alkenyl, which is optionally substituted with one or more substituents $R^5$ and wherein one or more non-adjacent $CH_2$-groups are each optionally substituted by $R^5C=CR^5$, $C≡C$, $Si(R^5)_2$, $Ge(R^5)_2$, $Sn(R^5)_2$, $C=O$, $C=S$, $C=Se$, $C=NR^5$, $P(=O)(R^5)$, SO, $SO_2$, $NR^5$, O, S or $CONR^5$;

$C_2$-$C_{40}$-alkynyl, which is optionally substituted with one or more substituents $R^5$ and wherein one or more non-adjacent $CH_2$-groups are each optionally substituted by $R^5C=CR^5$, $C≡C$, $Si(R^5)_2$, $Ge(R^5)_2$, $Sn(R^5)_2$, $C=O$, $C=S$, $C=Se$, $C=NR^5$, $P(=O)(R^5)$, SO, $SO_2$, $NR^5$, O, S or $CONR^5$;

$C_6$-$C_{60}$-aryl, which is optionally substituted with one or more substituents $R^5$; and $C_3$-$C_{57}$-heteroaryl, which is optionally substituted with one or more substituents $R^5$.

$R^5$ is at each occurrence independently from another selected from the group consisting of: hydrogen, deuterium, OPh, $CF_3$, CN, F, $C_1$-$C_5$-alkyl, wherein optionally one or more hydrogen atoms are independently from each other substituted by deuterium, CN, $CF_3$, or F;

$C_1$-$C_5$-alkoxy, wherein optionally one or more hydrogen atoms are independently from each other substituted by deuterium, CN, $CF_3$, or F;

$C_1$-$C_5$-thioalkoxy, wherein optionally one or more hydrogen atoms are independently from each other substituted by deuterium, CN, $CF_3$, or F;

$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_6$-$C_{18}$-aryl, which is optionally substituted with one or more $C_1$-$C_5$-alkyl substituents;

$C_3$-$C_{17}$-heteroaryl, which is optionally substituted with one or more $C_1$-$C_5$-alkyl substituents;

$N(C_6$-$C_{18}$-aryl$)_2$, $N(C_3$-$C_{17}$-heteroaryl$)_2$; and $N(C_3$-$C_{17}$-heteroaryl$)(C_6$-$C_{18}$-aryl$)$.

$R^6$ is at each occurrence independently from another selected from the group consisting of hydrogen, deuterium, OPh, $CF_3$, CN, F, $C_1$-$C_5$-alkyl, wherein optionally one or more hydrogen atoms are independently from each other substituted by deuterium, CN, $CF_3$, or F;

$C_1$-$C_5$-alkoxy, wherein optionally one or more hydrogen atoms are independently from each other substituted by deuterium, CN, $CF_3$, or F;

$C_1$-$C_5$-thioalkoxy, wherein optionally one or more hydrogen atoms are independently from each other substituted by deuterium, CN, $CF_3$, or F;

$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_6$-$C_{18}$-aryl, which is optionally substituted with one or more $C_1$-$C_5$-alkyl substituents;

$C_3$-$C_{17}$-heteroaryl, which is optionally substituted with one or more $C_1$-$C_5$-alkyl substituents;

$N(C_6$-$C_{18}$-aryl$)_2$, $N(C_3$-$C_{17}$-heteroaryl$)_2$; and $N(C_3$-$C_{17}$-heteroaryl$)(C_6$-$C_{18}$-aryl$)$.

According to a preferred embodiment, two or more of the substituents selected from the group consisting of $R^I$, $R^{II}$, $R^{III}$, $R^{IV}$, $R^V$, $R^{VI}$, $R^{VII}$, $R^{VIII}$, $R^{IX}$, $R^X$, and $R^{XI}$ that are positioned adjacent to another may each form a mono- or polycyclic, aliphatic, aromatic and/or benzo-fused ring system with another.

According to a preferred embodiment, at least one of $X^1$, $X^2$ and $X^3$ is B and at least one of $X^1$, $X^2$ and $X^3$ is N.

According to a preferred embodiment of the invention, at least one substituent selected from the group consisting of $R^I$, $R^{II}$, $R^{III}$, $R^{IV}$, $R^V$, $R^{VI}$, $R^{VII}$, $R^{VIII}$, $R^{IX}$, $R^X$, and $R^{XI}$ optionally forms a mono- or polycyclic, aliphatic, aromatic and/or benzo-fused ring system with one or more substituents of the same group that is/are positioned adjacent to the at least one substituent.

In one embodiment, the NRCT emitter compound $E^{NRCT}$ comprises or consists of a structure according to Formula (In) and $X^1$ and $X^3$ each are N and $X^2$ is B:

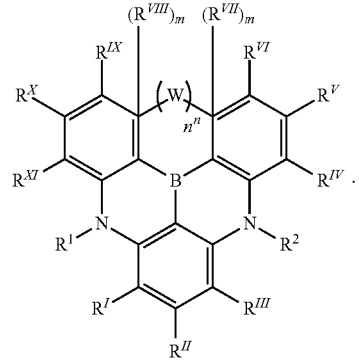

Formula (Ina)

In one embodiment, the NRCT emitter compound E$^{NRCT}$ comprises or consists of a structure according to Formula (In) and X$^1$ and X$^3$ each are B and X$^2$ is N:

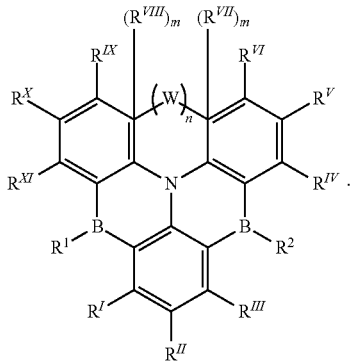

Formula (Inb)

In one embodiment, the NRCT emitter compound E$^{NRCT}$ comprises or consists of a structure according to Formula (In) and n″=0.

In a preferred embodiment, NRCT emitter compound E$^{NRCT}$ comprises or consists of a structure according to Formula (Ina) and n″=0.

In one embodiment, each of R$^1$ and R$^2$ is each independently from each other selected from the group consisting of
C$_1$-C$_5$-alkyl, which is optionally substituted with one or more substituents R$^6$;
C$_6$-C$_{30}$-aryl, which is optionally substituted with one or more substituents R$^6$; and
C$_3$-C$_{30}$-heteroaryl, which is optionally substituted with one or more substituents R$^6$.

In one embodiment, R$^1$ and R$^2$ is each independently from each other selected from the group consisting of Me, $^i$Pr, $^t$Bu, CN, CF$_3$,
Ph, which is optionally substituted with one or more substituents independently from each other selected from the group consisting of Me, Pr, tBu, CN, CF$_3$, and Ph;
pyridinyl, which is optionally substituted with one or more substituents independently from each other selected from the group consisting of Me, $^i$Pr, $^t$Bu, CN, CF$_3$, and Ph;
pyrimidinyl, which is optionally substituted with one or more substituents independently from each other selected from the group consisting of Me, $^i$Pr, $^t$Bu, CN, CF$_3$, and Ph; and
triazinyl, which is optionally substituted with one or more substituents independently from each other selected from the group consisting of Me, $^i$Pr, $^t$Bu, CN, CF$_3$, and Ph.

In one embodiment, each of R$^I$, R$^{II}$, R$^{III}$, R$^{IV}$, R$^V$, R$^{VI}$, R$^{VII}$, R$^{VIII}$, R$^{IX}$, R$^X$, and R$^{XI}$ is independently from another selected from the group consisting of: hydrogen, deuterium, halogen, Me, $^i$Pr, $^t$Bu, CN, CF$_3$,
Ph, which is optionally substituted with one or more substituents independently from each other selected from the group consisting of Me, $^i$Pr, $^t$Bu, CN, CF$_3$, and Ph;
pyridinyl, which is optionally substituted with one or more substituents independently from each other selected from the group consisting of Me, $^i$Pr, $^t$Bu, CN, CF$_3$, and Ph;
pyrimidinyl, which is optionally substituted with one or more substituents independently from each other selected from the group consisting of Me, $^i$Pr, $^t$Bu, CN, CF$_3$, and Ph;
carbazolyl, which is optionally substituted with one or more substituents independently from each other selected from the group consisting of Me, $^i$Pr, $^t$Bu, CN, CF$_3$, and Ph;
triazinyl, which is optionally substituted with one or more substituents independently from each other selected from the group consisting of Me, $^i$Pr, $^t$Bu, CN, CF$_3$, and Ph;
and N(Ph)$_2$.

In one embodiment, each of R$^I$, R$^{II}$, R$^{III}$, R$^{IV}$, R$^V$, R$^{VI}$, R$^{VII}$, R$^{VIII}$, R$^{IX}$, R$^X$, and R$^{XI}$ is independently from another selected from the group consisting of: hydrogen, deuterium, halogen, Me, $^i$Pr, $^t$Bu, CN, CF$_3$,
Ph, which is optionally substituted with one or more substituents independently from each other selected from the group consisting of Me, $^i$Pr, $^t$Bu, CN, CF$_3$, and Ph;
pyridinyl, which is optionally substituted with one or more substituents independently from each other selected from the group consisting of Me, $^i$Pr, $^t$Bu, CN, CF$_3$, and Ph;
pyrimidinyl, which is optionally substituted with one or more substituents independently from each other selected from the group consisting of Me, $^i$Pr, $^t$Bu, CN, CF$_3$, and Ph;
carbazolyl, which is optionally substituted with one or more substituents independently from each other selected from the group consisting of Me, $^i$Pr, $^t$Bu, CN, CF$_3$, and Ph;
triazinyl, which is optionally substituted with one or more substituents independently from each other selected from the group consisting of Me, $^i$Pr, $^t$Bu, CN, CF$_3$, and Ph;
and N(Ph)$_2$; and R$^1$ and R$^2$ is each independently from each other selected from the group consisting of
C$_1$-C$_5$-alkyl, which is optionally substituted with one or more substituents R$^6$;
C$_6$-C$_{30}$-aryl, which is optionally substituted with one or more substituents R$^6$; and
C$_3$-C$_{30}$-heteroaryl, which is optionally substituted with one or more substituents R$^6$.

In one embodiment, the NRCT emitter compound is a blue boron-containing NRCT emitter selected from the following group:

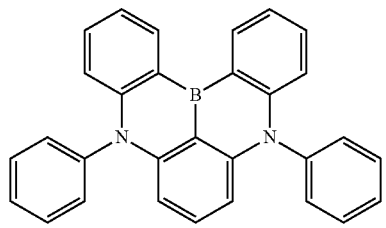

37
-continued
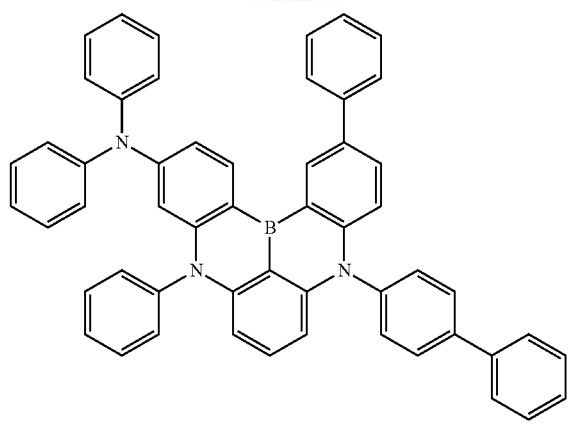
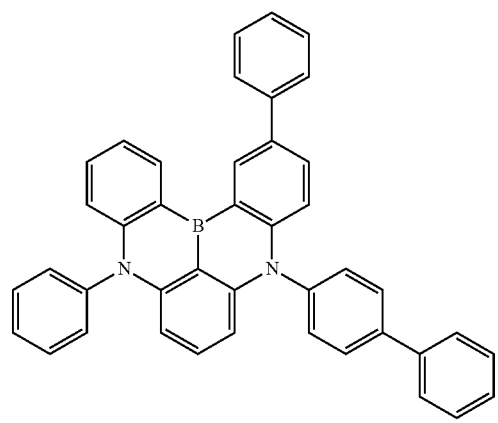
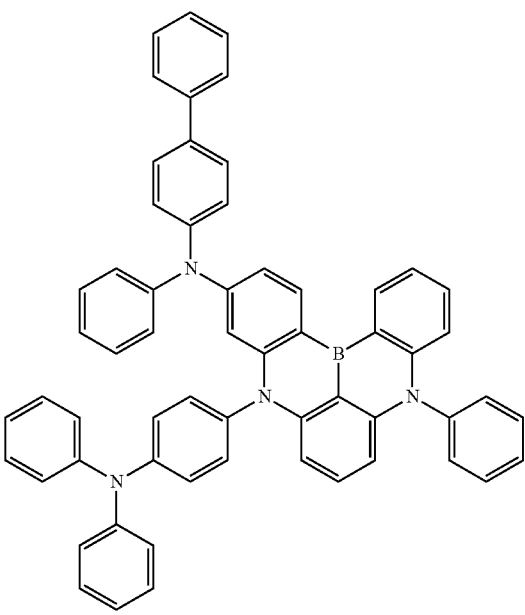
38
-continued
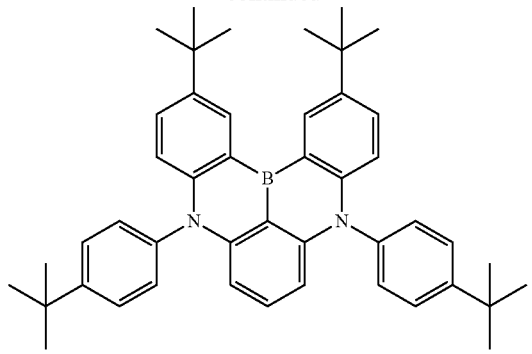
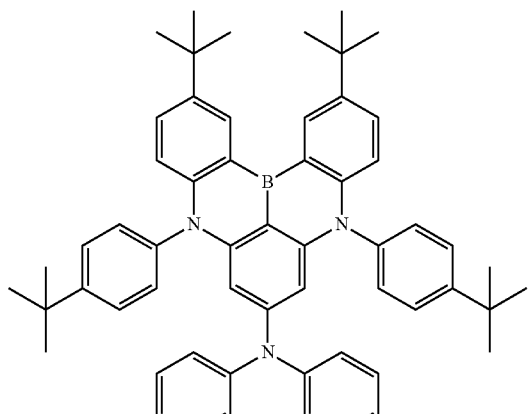
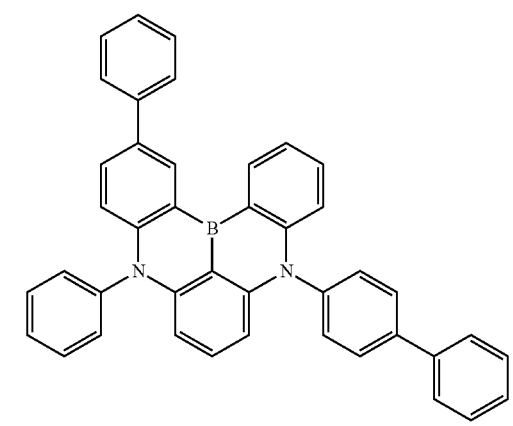
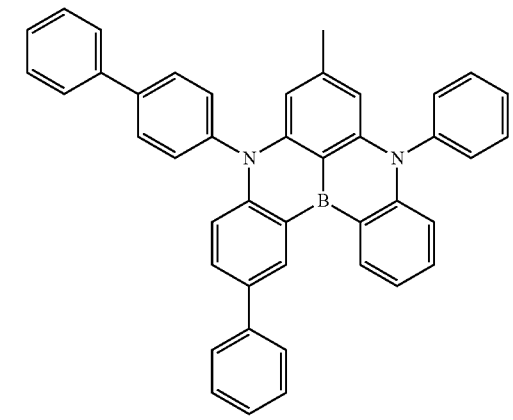

-continued

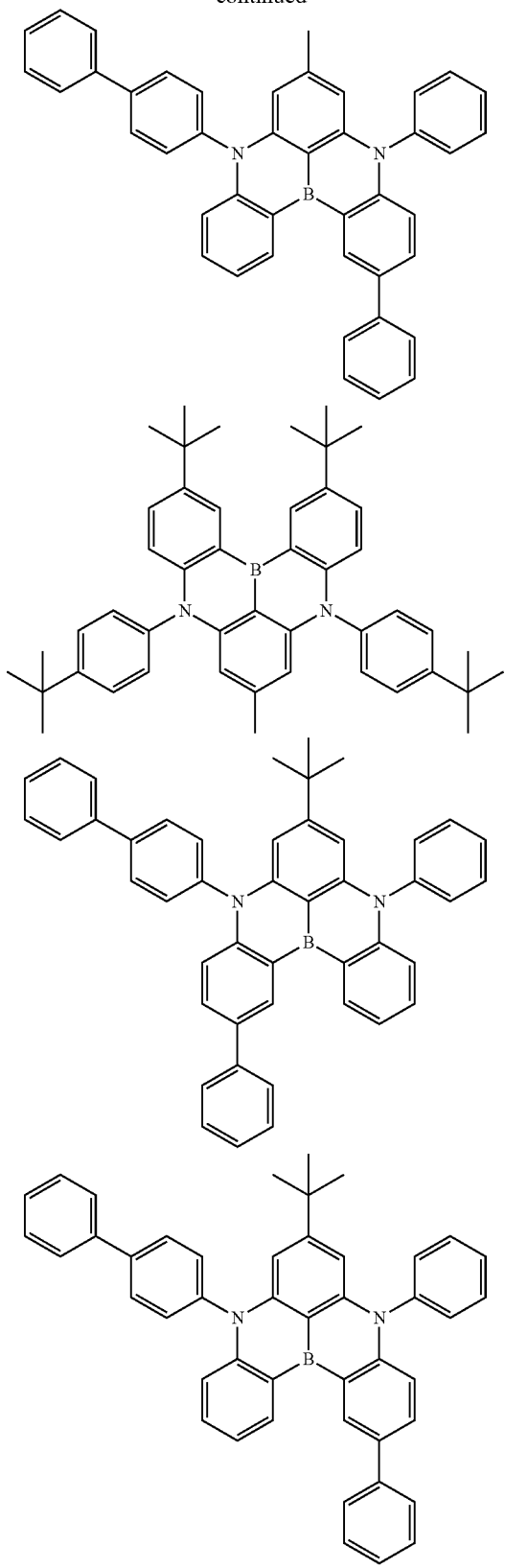

The person skilled in the art will notice that the light-emitting layer B will typically be incorporated in the organic electroluminescent device. Preferably, such organic electroluminescent device comprises at least the following layers: at least one light-emitting layer B, at least one anode layer A and at least one cathode layer C.

Preferably, the anode layer A contains at least one component selected from the group consisting of indium tin oxide, indium zinc oxide, PbO, SnO, graphite, doped silicium, doped germanium, doped GaAs, doped polyaniline, doped polypyrrole, doped polythiophene, and mixtures of two or more thereof.

Preferably, the cathode layer C contains at least one component selected from the group consisting of Al, Au, Ag, Pt, Cu, Zn, Ni, Fe, Pb, In, W, Pd, LiF, Ca, Ba, Mg, and mixtures or alloys of two or more thereof, Preferably, the light-emitting layer B is located between an anode layer A and a cathode layer C. Accordingly, the general set-up is preferably A—B—C. This does of course not exclude the presence of one or more optional further layers. These can be present at each side of A, of B and/or of C.

In a preferred embodiment, the organic electroluminescent device comprises at least the following layers:
A) an anode layer A containing at least one component selected from the group consisting of indium tin oxide, indium zinc oxide, PbO, SnO, graphite, doped silicium, doped germanium, doped GaAs, doped polyaniline, doped polypyrrole, doped polythiophene, and mixtures of two or more thereof;
B) the light-emitting layer B; and
C) a cathode layer C containing at least one component selected from the group consisting of Al, Au, Ag, Pt, Cu, Zn, Ni, Fe, Pb, In, W, Pd, LiF, Ca, Ba, Mg, and mixtures or alloys of two or more thereof,
wherein the light-emitting layer B is located between the anode layer A and the a cathode layer C.

Exemplarily, when the organic electroluminescent device is an OLED, it may optionally comprise the following layer structure:
A) an anode layer A, exemplarily comprising indium tin oxide (ITO);
HTL) a hole transport layer HTL;
B) a light-emitting layer B according to the present invention as described herein;
ETL) an electron transport layer ETL; and
C) a cathode layer, exemplarily comprising Al, Ca and/or Mg.

Preferably, the order of the layers herein is A—HTL—B-ETL—C.

Furthermore, the organic electroluminescent device may optionally comprise one or more protective layers protecting the device from damaging exposure to harmful species in the environment including, exemplarily moisture, vapor and/or gases. Preferably, the anode layer A is located on the surface of a substrate. The substrate may be formed by any material or composition of materials. Most frequently, glass slides are used as substrates. Alternatively, thin metal layers (e.g., copper, gold, silver or aluminum films) or plastic films or slides may be used. This may allow a higher degree of flexibility.

The anode layer A is mostly composed of materials allowing to obtain an (essentially) transparent film. As at least one of both electrodes should be (essentially) transparent in order to allow light emission from the OLED, either the anode layer A or the cathode layer C transparent. Preferably, the anode layer A comprises a large content or even consists of transparent conductive oxides (TCOs). Such anode layer A may exemplarily comprise indium tin oxide, aluminum zinc oxide, fluor tin oxide, indium zinc oxide, PbO, SnO, zirconium oxide, molybdenum oxide, vanadium oxide, wolfram oxide, graphite, doped Si, doped Ge, doped GaAs, doped polyaniline, doped polypyrrol and/or doped polythiophene.

Particularly preferably, the anode layer A (essentially) consists of indium tin oxide (ITO) (e.g., $(InO_3)_{0.9}(SnO_2)_{0.1}$). The roughness of the anode layer A caused by the transparent conductive oxides (TCOs) may be compensated by using a hole injection layer (HIL). Further, the HIL may facilitate the injection of quasi charge carriers (i.e., holes) in that the transport of the quasi charge carriers from the TCO to the hole transport layer (HTL) is facilitated. The hole injection layer (HIL) may comprise poly-3,4-ethylendioxy thiophene (PEDOT), polystyrene sulfonate (PSS), $MoO_2$, $V_2O_5$, CuPC or CuI, in particular a mixture of PEDOT and PSS. The hole injection layer (HIL) may also prevent the diffusion of metals from the anode layer A into the hole transport layer (HTL). The HIL may exemplarily comprise PEDOT:PSS (poly-3,4-ethylendioxy thiophene: polystyrene sulfonate), PEDOT (poly-3,4-ethylendioxy thiophene), mMTDATA (4,4',4"-tris[phenyl(m-tolyl)amino]triphenylamine), Spiro-TAD (2,2',7,7'-tetrakis(n,n-diphenylamino)-9,9'-spirobifluorene), DNTPD (N1,N1'-(biphenyl-4,4'-diyl)bis(N1-phenyl-N4, N4-di-m-tolylbenzene-1,4-diamine), NPB (N,N'-nis-(1-naphthalenyl)-N,N'-bis-phenyl-(1,1'-biphenyl)-4,4'-diamine), NPNPB (N,N'-diphenyl-N,N'-di-[4-(N,N-diphenyl-amino)phenyl]benzidine), MeO-TPD (N,N,N',N'-tetrakis(4-methoxyphenyl)benzidine), HAT-CN (1,4,5,8,9,11-hexaazatriphenylen-hexacarbonitrile) and/or Spiro-NPD (N,N'-diphenyl-N,N'-bis-(1-naphthyl)-9,9'-spirobifluorene-2,7-diamine).

Adjacent to the anode layer A or hole injection layer (HIL) typically a hole transport layer (HTL) is located. Herein, any hole transport compound may be used. Exemplarily, electron-rich heteroaromatic compounds such as triarylamines and/or carbazoles may be used as hole transport compound. The HTL may decrease the energy barrier between the anode layer A and the light-emitting layer B (serving as emitting layer (EML)).

The hole transport layer (HTL) may also be an electron blocking layer (EBL). Preferably, hole transport compounds bear comparably high energy levels of their triplet states T1. Exemplarily the hole transport layer (HTL) may comprise a star-shaped heterocycle such as tris(4-carbazoyl-9-ylphenyl) amine (TCTA), poly-TPD (poly(4-butylphenyl-diphenyl-amine)), [alpha]-NPD (poly(4-butylphenyl-diphenyl-amine)), TAPC (4,4'-cyclohexyliden-bis[N,N-bis(4-methylphenyl)benzenamine]), 2-TNATA (4,4',4"-tris[2-naphthyl(phenyl)amino]triphenylamine), Spiro-TAD, DNTPD, NPB, NPNPB, MeO-TPD, HAT-CN and/or TrisPcz (9,9'-diphenyl-6-(9-phenyl-9H-carbazol-3-yl)-9H,9'H-3,3'-bicarbazole). In addition, the HTL may comprise a p-doped layer, which may be composed of an inorganic or organic dopant in an organic hole-transporting matrix. Transition metal oxides such as vanadium oxide, molybdenum oxide or tungsten oxide may exemplarily be used as inorganic dopant. Tetrafluorotetracyanoquinodimethane (F4-TCNQ), copper-pentafluorobenzoate (Cu(I)pFBz) or transition metal complexes may exemplarily be used as organic dopant.

The EBL may exemplarily comprise mCP (1,3-bis(carbazol-9-yl)benzene), TCTA, 2-TNATA, mCBP (3,3-di(9H-carbazol-9-yl)biphenyl), tris-Pcz, CzSi (9-(4-tert-Butylphenyl)-3,6-bis(triphenylsilyl)-9H-carbazole) and/or DCB (N,N'-dicarbazolyl-1,4-dimethylbenzene).

Adjacent to the hole transport layer (HTL), typically, the light-emitting layer B is located. This is specified in detail in the context of the present invention.

Adjacent to the light-emitting layer B an electron transport layer (ETL) may be located. Herein, any electron transporter may be used. Exemplarily, compounds poor of electrons such as, e.g., benzimidazoles, pyridines, triazoles, oxadiazoles (e.g., 1,3,4-oxadiazole), phosphinoxides and sulfone, may be used. Exemplarily, an electron transporter may also be a star-shaped heterocycle such as 1,3,5-tri(1-phenyl-1H-benzo[d]imidazol-2-yl)phenyl (TPBi). The electron transport layer (ETL) may also block holes or a hole blocking layer (HBL) is introduced. The ETL may exemplarily comprise AlQ3, TSPO1, BPyTP2 (2,7-di(2,2'-bipyridin-5-yl)triphenyle), Sif87 (dibenzo[b,d]thiophen-2-yltriphenylsilane), Sif88 (dibenzo[b,d]thiophen-2-yl)diphenylsilane), BmPyPhB (1,3-bis[3,5-di(pyridin-3-yl)phenyl]benzene) and/or BTB (4,4'-bis-[2-(4,6-diphenyl-1,3,5-triazinyl)]-1,1'-biphenyl).

The HBL may exemplarily comprise BCP (2,9-dimethyl-4,7-diphenyl-1,10-phenanthroline=Bathocuproine), BAlq (bis(8-hydroxy-2-methylquinoline)-(4-phenylphenoxy)aluminum), NBphen (2,9-bis(naphthalen-2-yl)-4,7-diphenyl-1,10-phenanthroline), Alq3 (Aluminum-tris(8-hydroxyquinoline)), TSPO1 (diphenyl-4-triphenylsilylphenyl-phosphinoxide) and/or TCB/TCP (1,3,5-tris(N-carbazolyl)benzol/1,3,5-tris(carbazol)-9-yl) benzene).

Adjacent to the electron transport layer (ETL), a cathode layer C may be located. Exemplarily, the cathode layer C may comprise or may consist of a metal (e.g., Al, Au, Ag, Pt, Cu, Zn, Ni, Fe, Pb, LiF, Ca, Ba, Mg, In, W, or Pd) or a metal alloy. For practical reasons, the cathode layer may also consist of (essentially) intransparent metals such as Mg, Ca or Al. Alternatively or additionally, the cathode layer C may also comprise graphite and or carbon nanotubes (CNTs). Alternatively, the cathode layer C may also consist of nanoscalic silver wires.

An OLED may further, optionally, comprise a protection layer between the electron transport layer (ETL) and the cathode layer C (which may be designated as electron injection layer (EIL)). This layer may comprise lithium fluoride, cesium fluoride, silver, Liq (8-hydroxyquinolinolatolithium), $Li_2O$, $BaF_2$, MgO and/or NaF.

Optionally, also the electron transport layer (ETL) and/or a hole blocking layer (HBL) may comprise one or more host compounds H.

Optionally, an organic electroluminescent device (e.g., an OLED) may exemplarily be an essentially white organic electroluminescent device. Exemplarily such white organic electroluminescent device may comprise at least one (deep) blue emitter compound and one or more emitter compounds emitting green and/or red light. Then, there may also optionally be energy transmittance between two or more compounds as described above.

The organic electroluminescent device as a whole may also form a thin layer of a thickness of not more than 5 mm, more than 2 mm, more than 1 mm, more than 0.5 mm, more than 0.25 mm, more than 100 µm, or more than 10 µm.

An organic electroluminescent device (e.g., an OLED) may be a small-sized (e.g., having a surface not larger than 5 mm, or even not larger than 1 mm), medium-sized (e.g., having a surface in the range of 0.5 to 20 cm), or a large-sized (e.g., having a surface larger than 20 cm).

An organic electroluminescent device (e.g., an OLED) according to the present invention may optionally be used for generating screens, as large-area illuminating device, as luminescent wallpaper, luminescent window frame or glass, luminescent label, luminescent poser or flexible screen or display. Next to the common uses, an organic electroluminescent device (e.g., an OLED) may exemplarily also be used as luminescent films, "smart packaging" labels, or innovative design elements. Further they are usable for cell detection and examination (e.g., as bio labelling).

One of the main purposes of an organic electroluminescent device is the generation of light. Thus, the present invention further relates to a method for generating light of a desired wavelength range, comprising the step of providing an organic electroluminescent device according to any the present invention.

Accordingly, a further aspect of the present invention relates to a method for generating light of a desired wavelength range, comprising the steps of
(i) providing an organic electroluminescent device according to the present invention; and
(ii) applying an electrical current to said organic electroluminescent device.

Accordingly, the present invention also relates to a method for generating blue, green, yellow, orange and red light.

As used herein, if not defined more specifically in a particular context, the designation of the colors of emitted and/or absorbed is as follows:
violet: wavelength range of >380-420 nm;
deep blue: wavelength range of >420-470 nm;
sky blue: wavelength range of >470-500 nm;
green: wavelength range of >500-560 nm;
yellow: wavelength range of >560-580 nm;
orange: wavelength range of >580-620 nm;
red: wavelength range of >620-800 nm.

With respect to emitter compounds E, such colors refer to the emission maximum. Therefore, exemplarily, a deep blue emitter has an emission maximum in the range of from 420 to 470 nm, a sky blue emitter has an emission maximum in the range of from 470 to 500 nm, a green emitter has an emission maximum in a range of from 500 to 560 nm, a red emitter has an emission maximum in a range of from 620 to 800 nm.

A deep blue emitter may preferably have an emission maximum of below 470 nm, more preferably below 465 nm, even more preferably below 460 nm or even below 450 nm. It will typically be above 410 nm, preferably above 420 nm, more preferably above 430 nm.

Accordingly, a further aspect of the present invention relates to an OLED, which exhibits an external quantum efficiency at 1000 cd/m$^2$ of more than 5%, more preferably of more than 8%, more preferably of more than 10%, even more preferably of more than 13% or even more than 20% and/or exhibits an emission maximum between 420 nm and 500 nm, preferably between 430 nm and 490 nm, more preferably between 440 nm and 480 nm, even more preferably between 450 nm and 470 nm and/or exhibits a LT80 value at 500 cd/m$^2$ of more than 70 h, preferably more than 100 h, more preferably more than 200 h, even more preferably more than 300 h or even more than 400 h. Accordingly, a further aspect of the present invention relates to an OLED, whose emission exhibits a CIE$_y$ color coordinate of below 0.40, preferably below 0.30, more preferably below 0.20 or even more preferably below 0.15 or even below 0.1.

A further aspect of the present invention relates to an OLED, which emits light at a distinct color point. According to the present invention, the OLED emits light with a narrow emission band (small full width at half maximum (FWHM)). In one aspect, the OLED according to the invention emits light with a FWHM of the main emission peak of below 0.50 eV, more preferably of below 0.46 eV, even more preferably of below 0.43 eV or even below 0.41 eV.

In the following, some exemplary structures and uses of host compounds H and devices are provided which, together with the claims, are intended to illustrate the invention further.

EXAMPLES

Cyclic Voltammetry

Cyclic voltammograms of solutions having concentration of 10$^{-3}$ mol/l of the organic molecules in dichloromethane or a suitable solvent and a suitable supporting electrolyte (e.g. 0.1 mol/l of tetrabutylammonium hexafluorophosphate) are measured. The measurements are conducted at room temperature and under nitrogen atmosphere with a three-electrode assembly (Working and counter electrodes: Pt wire, reference electrode: Pt wire) and calibrated using FeCp$_2$/FeCp$_2^+$ as internal standard. HOMO data was corrected using ferrocene as internal standard against SCE.

Density Functional Theory Calculation

Molecular structures are optimized employing the BP86 functional and the resolution of identity approach (RI). Excitation energies are calculated using the (BP86) optimized structures employing Time-Dependent DFT (TD-DFT) methods. Orbital and excited state energies are calculated with the B3LYP functional. Def2-SVP basis sets and a m4-grid for numerical integration were used. The Turbomole program package was used for all calculations.

Photophysical Measurements

Sample Pretreatment: Spin-Coating

Apparatus: Spin150, SPS euro.

The sample concentration is 10 mg/ml, dissolved in a suitable solvent.

Program: 1) 3 s at 400 U/min, 20 s at 1000 U/min at 1000 Upm/s. 3) 10 s at 4000 U/min at 1000 Upm/s. After coating, the films are tried at 70° C. for 1 min.

Photoluminescence Spectroscopy and TCSPC (Time-Correlated Single-Photon Counting)

Steady-state emission spectroscopy is recorded using a Horiba Scientific, Modell FluoroMax-4 equipped with a 150 W Xenon-Arc lamp, excitation- and emissions monochromators and a Hamamatsu R928 photomultiplier and a time-correlated single-photon counting option. Emissions and excitation spectra are corrected using standard correction fits.

Excited state lifetimes are determined employing the same system using the TCSPC method with FM-2013 equipment and a Horiba Yvon TCSPC hub.

Excitation Sources:

NanoLED 370 (wavelength: 371 nm, puls duration: 1,1 ns)

NanoLED 290 (wavelength: 294 nm, puls duration: <1 ns)

SpectraLED 310 (wavelength: 314 nm)

SpectraLED 355 (wavelength: 355 nm).

Data analysis (exponential fit) was done using the software suite DataStation and DAS6 analysis software. The fit is specified using the chi-squared-test.

Photoluminescence Quantum Yield Measurements

For photoluminescence quantum yield (PLQY) measurements an Absolute PL Quantum Yield Measurement C9920-03G system (Hamamatsu Photonics) is used. Quantum yields and CIE coordinates were determined using the software U6039-05 version 3.6.0.

Emission maxima are given in nm, quantum yields Φ in % and CIE coordinates as x,y values.

PLQY was determined using the following protocol:

1) Quality assurance: Anthracene in ethanol (known concentration) is used as reference
2) Excitation wavelength: the absorption maximum of the organic molecule is determined and the molecule is excited using this wavelength
3) Measurement Quantum yields are measured for sample of solutions or films under nitrogen atmosphere. The yield is calculated using the equation:

$$\Phi_{PL} = \frac{n_{photon},\ emited}{n_{photon},\ absorbed} = \frac{\int \frac{\lambda}{hc}\left[Int^{sample}_{emitted}(\lambda) - Int^{sample}_{absorbed}(\lambda)\right]d\lambda}{\int \frac{\lambda}{hc}\left[Int^{reference}_{emitted}(\lambda) - Int^{reference}_{absorbed}(\lambda)\right]d\lambda}$$

wherein $n_{photon}$ denotes the photon count and Int. is the intensity.

Production and Characterization of Organic Electroluminescence Devices

Via vacuum-deposition methods OLED devices comprising organic molecules according to the invention can be produced. If a layer contains more than one compound, the weight-percentage of one or more compounds is given in %. The total weight-percentage values amount to 100%, thus if a value is not given, the fraction of this compound equals to the difference between the given values and 100%.

The not fully optimized OLEDs are characterized using standard methods and measuring electroluminescence spectra, the external quantum efficiency (in %) in dependency on the intensity, calculated using the light detected by the photodiode, and the current. The OLED device lifetime is extracted from the change of the luminance during operation at constant current density. The LT50 value corresponds to the time, where the measured luminance decreased to 50% of the initial luminance, analogously LT80 corresponds to the time point, at which the measured luminance decreased to 80% of the initial luminance, LT97 to the time point, at which the measured luminance decreased to 97% of the initial luminance etc.

Accelerated lifetime measurements are performed (e.g. applying increased current densities). Exemplarily LT80 values at 500 cd/m² are determined using the following equation:

$$LT80\left(500\frac{cd^2}{m^2}\right) = LT80(L_0)\left(\frac{L_0}{500\frac{cd^2}{m^2}}\right)^{1.6}$$

wherein $L_0$ denotes the initial luminance at the applied current density.

The values correspond to the average of several pixels (typically two to eight), the standard deviation between these pixels is given. Figures show the data series for one OLED pixel.

Generalized Synthetic Route:

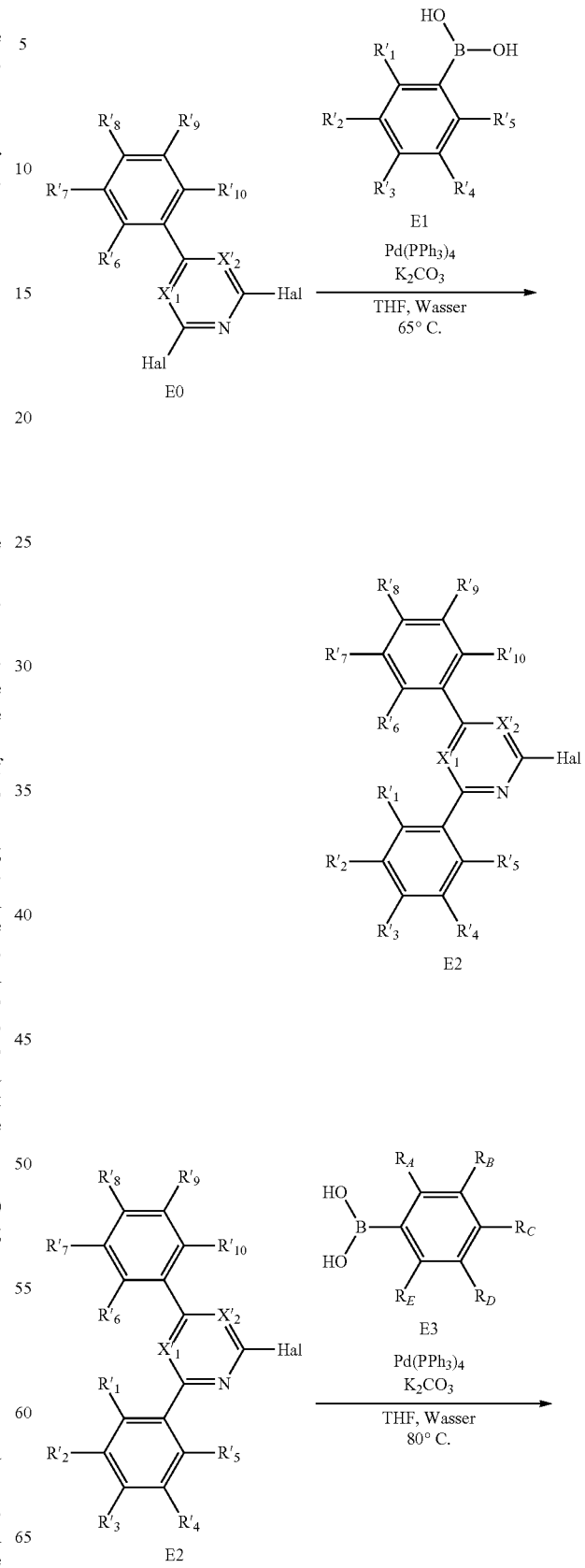

-continued

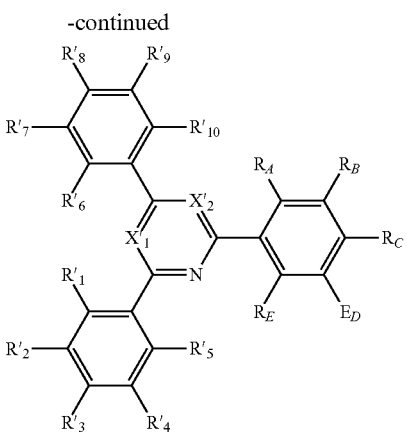

Hal = Cl, Br or I

Generalized Synthesis AAV0:

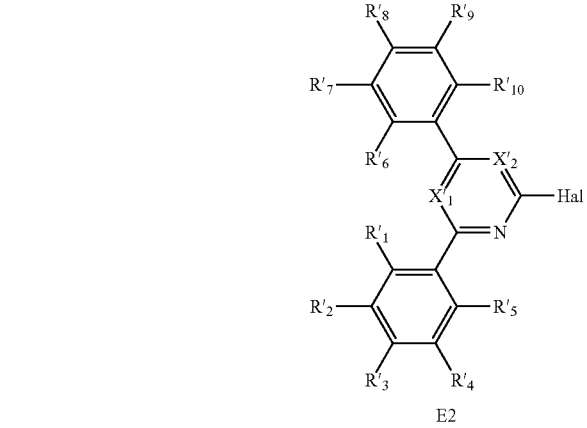

Hal = Cl, Br or I

E0 (1.00 equivalents), in which Hal preferably represents Cl, E1 (1.00 equivalents), Tetrakis(triphenylphosphine)palladium(0) (0.05 equivalents), and potassium carbonate (1.50 equivalents) are stirred under nitrogen atmosphere in a tetrahydrofuran (THF)/water mixture (ratio of 4:1) at 65° C. for 16 h. After cooling down to room temperature (rt), the mixture is extracted between toluene and water and washed with brine. The combined organic layers are dried over MgSO4, filtered and the solvent is removed under reduced pressure. The solid crude product E2 is purified by chromatography.

Generalized Synthesis AAV1:

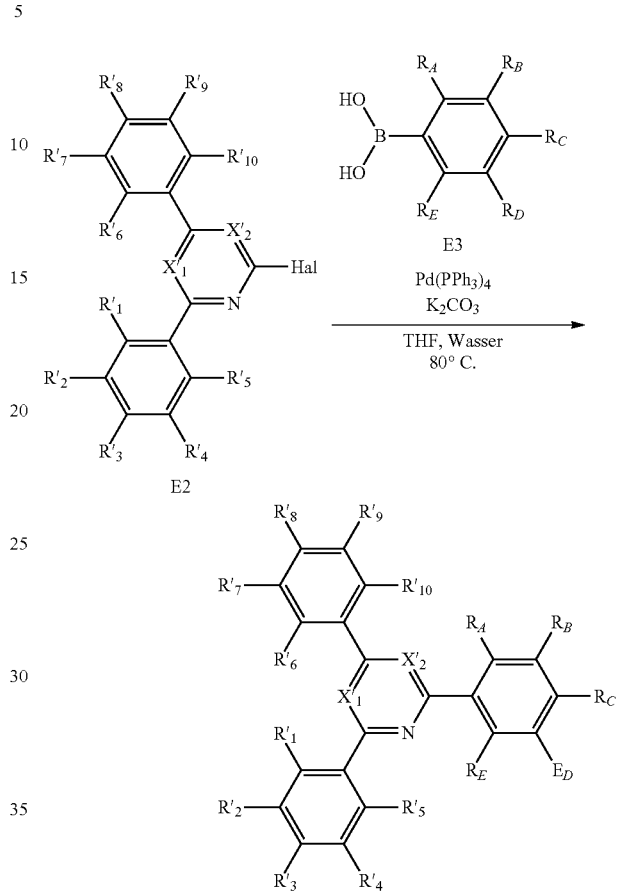

E2 (1.00 equivalents), in which Hal preferably represents Cl, E3 (1.20 equivalents), Tetrakis(triphenylphosphine)palladium(0) (0.05 equivalents), and potassium carbonate (1.50 equivalents) are stirred under nitrogen atmosphere in a tetrahydrofuran (THF)/water mixture (ratio of 10:1) at 80° C. for 16 h. After cooling down to room temperature (rt), the solvent is removed under reduced pressure. The mixture is extracted between dichloromethane (DCM) and water and washed with brine. The combined organic layers are dried over MgSO4, filtered and the solvent is removed under reduced pressure. The solid product is purified by chromatography.

In synthesis AAV0: and AAV1, a boronic acid ester, such as boronic acid pinacol ester, can be employed instead of the respective boronic acid group. In addition, different palladium catalysts may be employed. The skilled artesian is able to adapt solvents mixtures and reaction conditions to the used reactants and catalysts.

Synthesis of Compound 1

2,4-Dichloro-6-phenyl-1,3,5-triazine (CAS: 1700-02-3) was used as E1, and 3-cyanophenylboronic acid (CAS: 150255-96-2) is used as E2 to yield the intermediate Z1 (yield: 5%) according to AAV0. Z1 was then reacted with 3-(triphenylsilyl)phenylboronic acid (CAS: 1253912-58-1) according to AAV1 to yield Compound 1 (yield: 46%).

LC-MS: calculatedd for C40H28N4Si 592.77, found 593.33 (10.91 min)

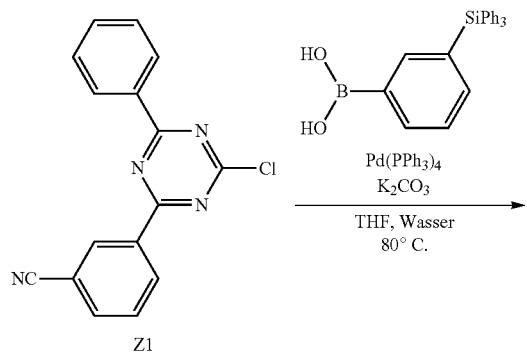
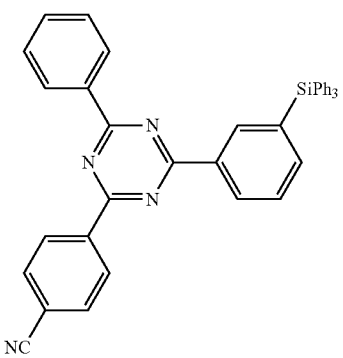
Compound 3
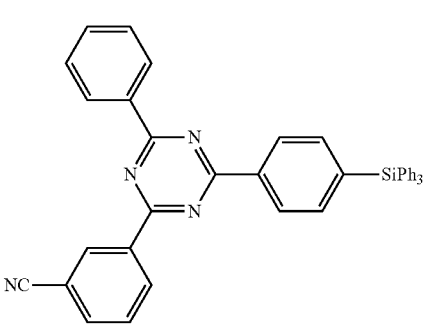
Compound 4
Compound 1
Compound 1
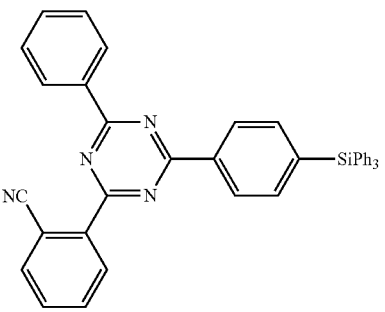
Compound 5
Compound 2
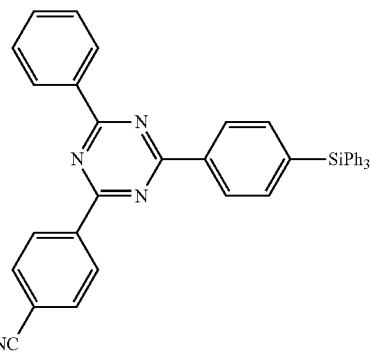
Compound 6

Compound 7
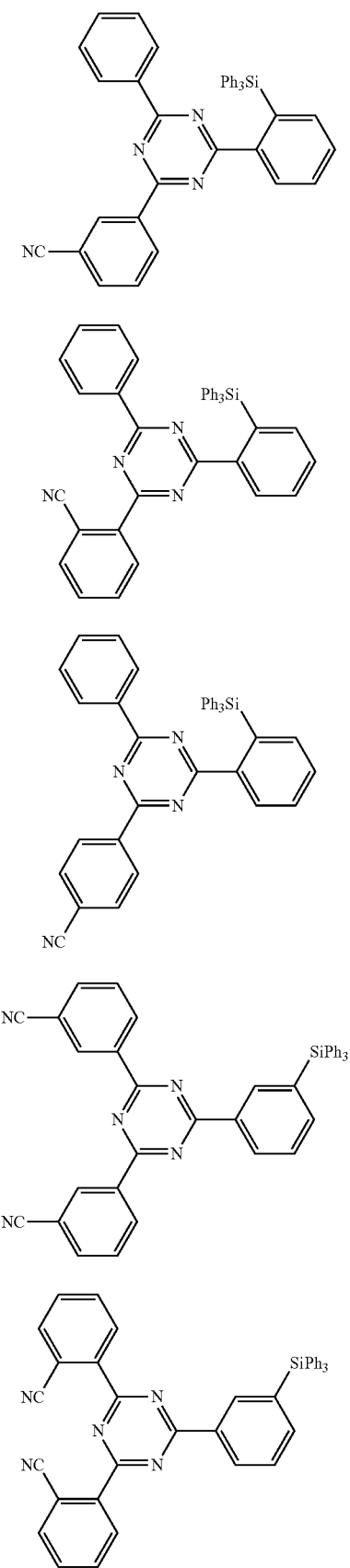
Compound 8
Compound 9
Compound 10
Compound 11
Compound 12
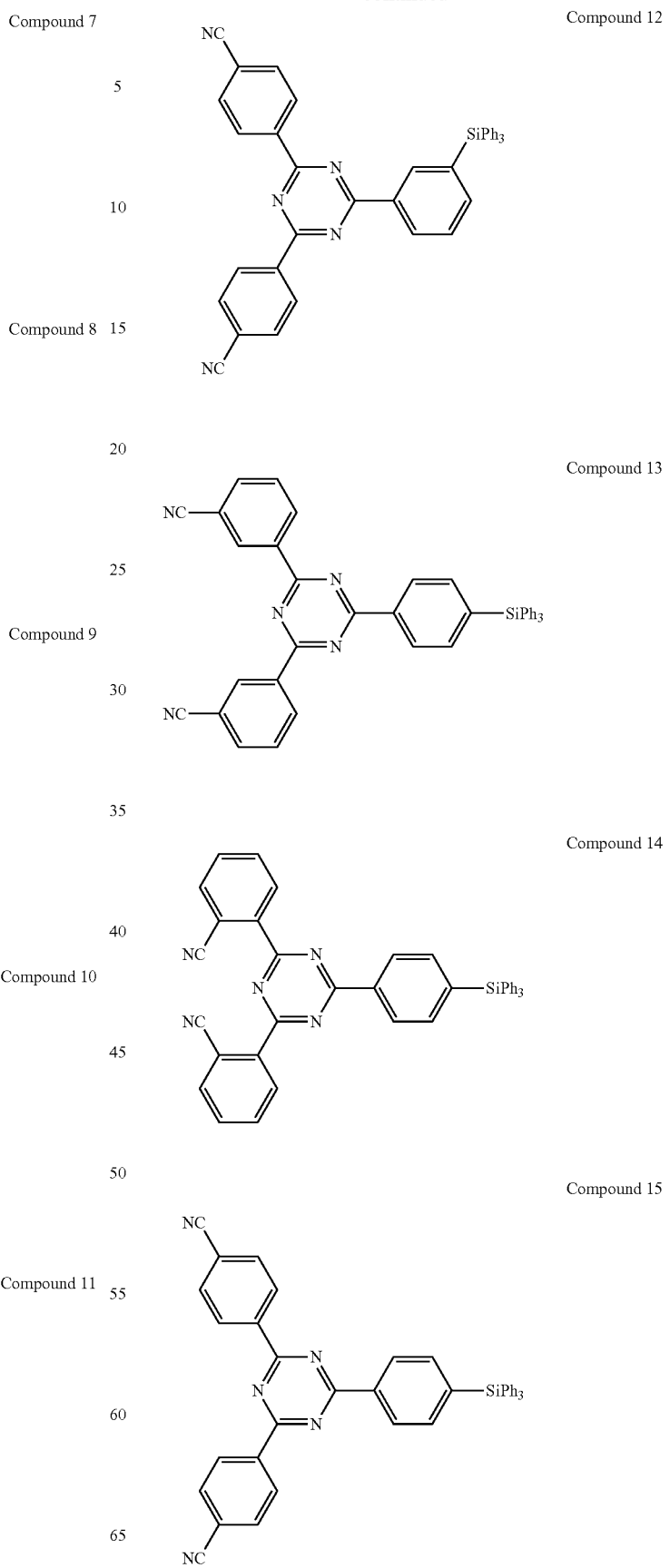
Compound 13
Compound 14
Compound 15

-continued

Compound 16

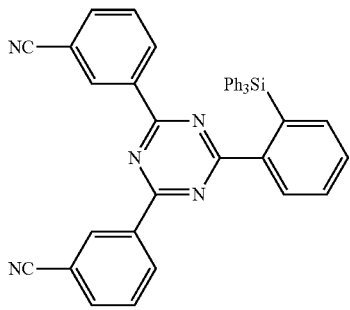

Compound 17

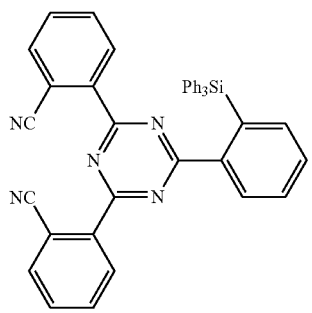

Compound 18

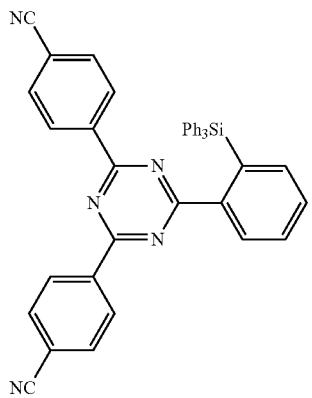

Device Examples

Compound 1 was tested in OLED devices (Devices D1, D2, and D3) and compared to Comparison Compound CC1 (Device C1) with the layer structure given in the following Table 1.

TABLE 1

| | | Design of Devices D1, D2 and C1 | | |
|---|---|---|---|---|
| Layer | thickness | D1 | D2 | C1 |
| 10 | 100 nm | Al | Al | Al |
| 9 | 2 nm | Liq | Liq | Liq |
| 8 | 20 nm | NBPhen | NBPhen | NBPhen |
| 7 | 10 nm | NBPhen | 1 | NBPhen |

TABLE 1-continued

| | | Design of Devices D1, D2 and C1 | | |
|---|---|---|---|---|
| Layer | thickness | D1 | D2 | C1 |
| 6 | 50 nm | mCBP (70%) 1 (20%) El (10%) | mCBP (70%) 1 (20%) El (10%) | mCBP (70%) CC1 (20%) El (10%) |
| 5 | 10 nm | mCBP | mCBP | mCBP |
| 4 | 10 nm | TCTA | TCTA | TCTA |
| 3 | 40 nm | NPB | NPB | NPB |
| 2 | 5 nm | HAT-CN | HAT-CN | HAT-CN |
| 1 | 50 nm | ITO | ITO | ITO |
| substrate | | glass | glass | glass |

D1: The emission maximum is determined at 475 nm at 6 V. The turn on voltage is 2.05 V. The EQE at 1000 cd/m$^2$ is 13.8%.

D2: The emission maximum is determined at 474 nm at 6 V. The turn on voltage is 2.05 V. The EQE at 1000 cd/m$^2$ is 16.8%.

C1: The emission maximum is determined at 474 nm at 6 V. The turn on voltage is 2.35 V. The EQE at 1000 cd/m$^2$ is 12.3%.

As can be seen from the experiments, by using at least one organic compound H in an emitting layer B of an organic electroluminescent device the turn on voltage can be beneficially decreased and the EQE is beneficially increased in comparison to using Comparison Compound CC1 in an emitting layer B of an organic electroluminescent device.

EI

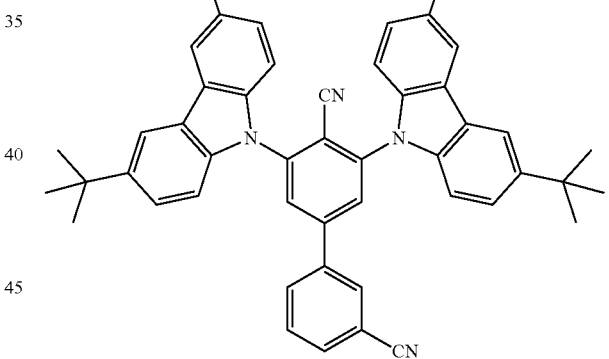

Emitter

CC1

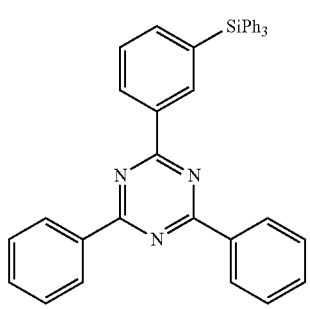

The invention claimed is:
1. An organic compound H of Formula (I):

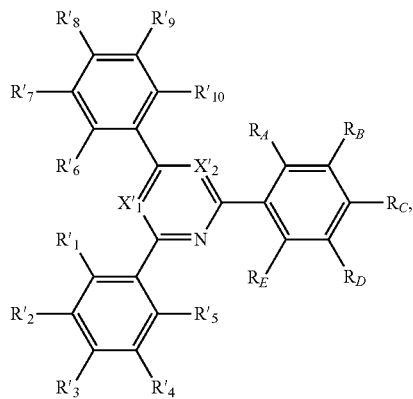

Formula (I)

wherein:
each of $X'_1$ and $X'_2$ is independently from another selected from the group consisting of N and $CR^{Tz}$;
$R^{Tz}$ is at each occurrence independently from another selected from the group consisting of hydrogen, deuterium, CN, $CF_3$, $C_1$-$C_{20}$-alkyl, $C_6$-$C_{18}$-aryl, and $C_7$-$C_{19}$-alkaryl and, wherein $C_6$-$C_{18}$-aryl or $C_7$-$C_{19}$-alkaryl can at each occurrence be optionally substituted by a residue selected from the group consisting of $C_1$-$C_{20}$-alkyl, $C_7$-$C_{19}$-alkaryl, and $C_6$-$C_{18}$-aryl;
$R'_1$, $R'_2$, $R'_3$, $R'_4$, $R'_5$, $R'_6$, $R'_7$, $R'_8$, $R'_9$, and $R'_{10}$ is independently from another selected from the group consisting of hydrogen, deuterium, CN, $CF_3$, $C_1$-$C_{20}$-alkyl, $C_6$-$C_{18}$-aryl, $C_7$-$C_{19}$-alkaryl, and $-SiR_FR_GR_H$, wherein $C_6$-$C_{18}$-aryl or $C_7$-$C_{19}$-alkaryl can at each occurrence be optionally substituted by a residue selected from the group consisting of $C_1$-$C_{20}$-alkyl, $C_7$-$C_{19}$-alkaryl, and $C_6$-$C_{18}$-aryl;
wherein at least one selected from the group consisting of $R'_1$, $R'_2$, $R'_3$, $R'_4$, $R'_5$, $R'_6$, $R'_7$, $R'_8$, $R'_9$, and $R'_{10}$ is CN;
each of $R_F$, $R_G$ and $R_H$ is selected from the group consisting of unsubstituted or substituted $C_6$-$C_{18}$-aryl, $C_1$-$C_{20}$-alkyl, $C_7$-$C_{19}$-alkaryl, $C_1$-$C_{20}$-heteroalkyl and $C_3$-$C_{17}$-heteroaryl;
$R_A$, $R_B$, $R_C$, $R_D$, and $R_E$, is independently from another selected from the group consisting of hydrogen, deuterium, CN, $CF_3$, $C_1$-$C_{20}$-alkyl, $C_6$-$C_{18}$-aryl, $C_7$-$C_{19}$-alkaryl, and $-SiR_KR_MR_N$, wherein $C_6$-$C_{18}$-aryl or $C_7$-$C_{19}$-alkaryl can at each occurrence be optionally substituted by a residue selected from the group consisting of $C_1$-$C_{20}$-alkyl, $C_7$-$C_{19}$-alkaryl, and $C_6$-$C_{18}$-aryl;
each of $R_K$, $R_M$, and $R_N$ is selected from the group consisting of unsubstituted or substituted $C_6$-$C_{18}$-aryl, $C_1$-$C_{20}$-alkyl, $C_7$-$C_{19}$-alkaryl, $C_1$-$C_{20}$-heteroalkyl and $C_3$-$C_{17}$-heteroaryl;
wherein at least one selected from the group consisting of $R_A$, $R_B$, $R_C$, $R_D$ and $R_E$ is $-SiR_KR_MR_N$.
2. The organic compound H according to claim 1, wherein at least one selected from the group consisting of $X'_1$ and $X'_2$ is N.
3. The organic compound H according to claim 1, wherein exactly one of $R_A$, $R_B$, $R_C$, $R_D$ and $R_E$ is $-SiR_KR_MR_N$.
4. The organic compound H according to claim 1, wherein $R_B$ is $-SiR_KR_MR_N$ and $R_A$, $R_C$, $R_D$ and $R_E$ are each hydrogen.

5. The organic compound H according to claim 1, wherein the organic compound H has a structure of the following Formula (II):

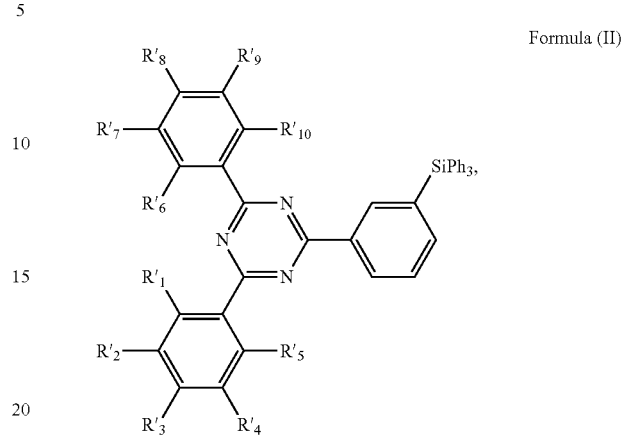

Formula (II)

wherein $R'_1$, $R'_2$, $R'_3$, $R'_4$, $R'_5$, $R'_6$, $R'_7$, $R'_8$, $R'_9$, and $R'^{10}$ are defined as in claim 1.
6. The organic compound H according to claim 1, wherein no more than two of $R'_1$, $R'_2$, $R'_3$, $R'_4$, $R'_5$, $R'_6$, $R'_7$, $R'_8$, $R'_9$, and $R'_{10}$ are CN.
7. The organic compound H according to claim 1, wherein exactly one of $R'_1$, $R'_2$, $R'_3$, $R'_4$, $R'_5$, $R'_6$, $R'_7$, $R'_8$, $R'_9$, and $R'_{10}$ is CN and the remaining residues selected from $R'_1$, $R'_2$, $R'_3$, $R'_4$, $R'_5$, $R'_6$, $R'_7$, $R'_8$, $R'_9$, and $R'_{10}$ are each hydrogen.
8. The organic compound H according to claim 1, wherein $R'_2$ is CN and $R'_1$, $R'_3$, $R'_4$, $R'_5$, $R'_6$, $R'_7$, $R'_8$, $R'_9$, and $R'_{10}$ are each hydrogen.
9. An organic electroluminescent device comprising a light-emitting layer B containing at least one organic compound H according to claim 1 as host.
10. The organic electroluminescent device according to claim 9, wherein said organic electroluminescent device is a device selected from the group consisting of an organic light emitting diode, a light emitting electrochemical cell, and a light-emitting transistor.
11. The organic electroluminescent device according to claim 9, wherein the light-emitting layer B comprises:
(i) 5-99% by weightof at least one host compound H according to claim 1;
(ii) 1-50% by weight of at least one emitter compound E; and optionally
(iii) 0-94% by weight of at least one further host compound D not according to Formula (I); and optionally
(iv) 0-10% by weight of at least one further emitter compound F not according to Formula (I); and optionally
(v) 0-94% by weight of a solvent.
12. The organic electroluminescent device according to claim 11, wherein the at least one emitter compound E is a TADF compound $E^{TADF}$.
13. The organic electroluminescent device according to claim 9, wherein the light-emitting layer B comprises:
(i) 5-99% by weight of at least one host compound H according to claim 1;
(ii) 0.1-10% by weight of at least one NRCT emitter compound $E^{NRCT}$; and
(iiia) 0.9-94.9% by weight of at least one further host compound D not according to Formula (I); or (iiib) 0.9-94.9% by weight of at least one TADF compound $E^{TADF}$ not according to Formula (I); and optionally (iv) 0-94% by weight of a solvent.

14. The organic electroluminescent device according to claim 9 further comprising at least one further host compound D, wherein the organic compound H has a lowest unoccupied molecule orbital LUMO(H) having an energy $E^{LUMO}(H)$ and the at least one further host compound D has a lowest unoccupied molecule orbital LUMO(D) having an energy $E^{LUMO}(D)$, wherein $E^{LUMO}(H) < E^{LUMO}(D)$.

15. The organic electroluminescent device according to claim 12, wherein the TADF emitter compound $E^{TADF}$ consists of a structure according to Formula (Is):

Formula (Is)

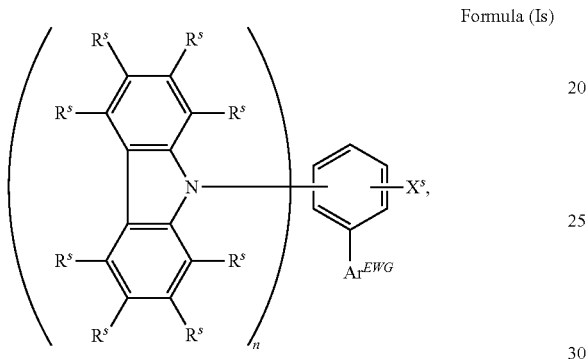

wherein n is at each occurrence independently from another 1 or 2;

$X^s$ is $SiPh_3$, CN or $CF_3$;

$Ar^{EWG}$ is at each occurrence independently from another a structure according to one of Formulas IIsa to IIsm Formula IIsa

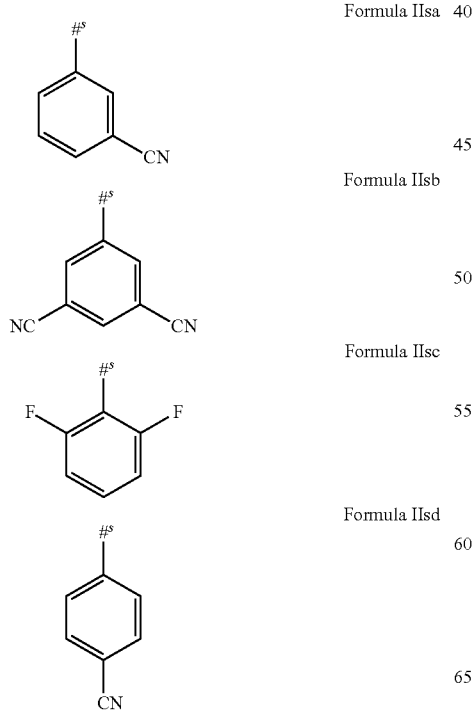

Formula IIsb

Formula IIsc

Formula IIsd

-continued

Formula IIse

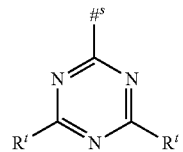

Formula IIsf

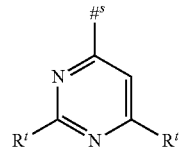

Formula IIsg

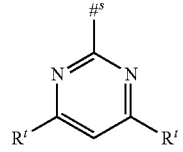

Formula IIsh

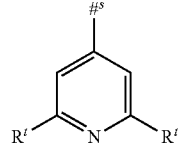

Formula IIsi

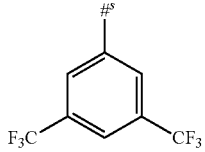

Formula IIsj

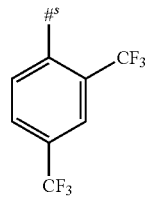

Formula IIsk

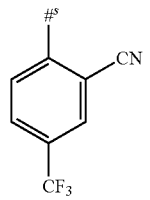

Formula IIsl

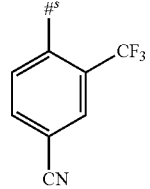

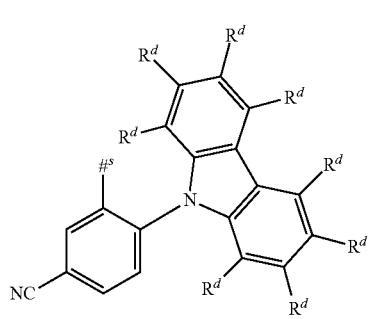

Formula IIsm wherein #$^s$ represents the binding site of the single bond linking Ar$^{EWG}$ to the substituted central phenyl ring of Formula 1s;

R$^t$ is at each occurrence independently from another selected from the group consisting of hydrogen, deuterium, C$_1$-C$_5$-alkyl, wherein one or more hydrogen atoms are optionally substituted by deuterium, and C$_6$-C$_{18}$-aryl, which is optionally substituted with one or more substituents R$^{6s}$;

R$^s$ is at each occurrence independently from another selected from the group consisting of hydrogen, deuterium, N(R$^{5s}$)$_2$, OR$^{5s}$, SR$^{5s}$, Si(R$^{5s}$)$_3$, CF$_3$, CN, F, C$_1$-C$_{40}$-alkyl which is optionally substituted with one or more substituents R$^{5s}$ and wherein one or more non-adjacent CH$_2$-groups are optionally substituted by R$^{5s}$C=CR$^{5s}$, C≡C, Si(R$^{5s}$)$_2$, Ge(R$^{5s}$)$_2$, Sn(R$^{5s}$)$_2$, C=O, C=S, C=Se, C=NR$^{5s}$, P(=O)(R$^{5s}$), SO, SO$_2$, NR$^{5s}$, O, S or CONR$^{5s}$;

C$_1$-C$_{40}$-thioalkoxy which is optionally substituted with one or more substituents RSS and wherein one or more non-adjacent CH$_2$-groups are optionally substituted by R$^{5s}$C=CR$^{5s}$, C≡C, Si(R$^{5s}$)$_2$, Ge(R$^{5s}$)$_2$, Sn(R$^{5s}$)$_2$, C=O, C=S, C=Se, C=NR$^{5s}$, P(=O)(R$^{5s}$), SO, SO$_2$, NR$^{5s}$, O, S or CONR$^{5s}$; and C$_6$-C$_{60}$-aryl which is optionally substituted with one or more substituents R$^{5s}$;

C$_3$-C$_{57}$-heteroaryl which is optionally substituted with one or more substituents R$^{5s}$;

R$^{5s}$ is at each occurrence independently from another selected from the group consisting of hydrogen, deuterium, N(R$^{6s}$)$_2$, OR$^{6s}$, SR$^{6s}$, Si(R$^{6s}$)$_3$, CF$_3$, CN, F, C$_1$-C$_{40}$-alkyl which is optionally substituted with one or more substituents R$^{6s}$ and wherein one or more non-adjacent CH$_2$-groups are optionally substituted by R$^{6s}$C=CR$^{6s}$, C≡C, Si(R$^{6s}$)$_2$, Ge(R$^{6s}$)$_2$, Sn(R$^6$S)$_2$, C=O, C=S, C=Se, C=NR$^{6s}$, P(=O)(R$^{6s}$), SO, SO$_2$, NR$^{6s}$, O, S or CONR$^{6s}$, C$_6$-C$_{60}$-aryl which is optionally substituted with one or more substituents R$^{6s}$; and C$_3$-C$_{57}$-heteroaryl which is optionally substituted with one or more substituents R$^{6s}$;

R$^{6s}$ is at each occurrence independently from another selected from the group consisting of hydrogen, deuterium, OPh, CF$_3$, CN, F, C$_1$-C$_5$-alkyl, wherein one or more hydrogen atoms are optionally, independently from each other substituted by deuterium, CN, CF$_3$, or F; C$_1$-C$_5$-alkoxy, wherein one or more hydrogen atoms are optionally, independently from each other substituted by deuterium, CN, CF$_3$, or F;

C$_1$-C$_5$-thioalkoxy, wherein one or more hydrogen atoms are optionally, independently from each other substituted by deuterium, CN, CF$_3$, or F;

C$_6$-C$_{18}$-aryl which is optionally substituted with one or more C$_1$-C$_5$-alkyl substituents;

C$_3$-C$_{17}$-heteroaryl which is optionally substituted with one or more C$_1$-C$_5$-alkyl substituents;

N(C$_6$-C$_{18}$-aryl)$_2$,

N(C$_3$-C$_{17}$-heteroaryl)$_2$, and

N(C$_3$-C$_{17}$-heteroaryl)(C$_6$-C$_{18}$-aryl);

R$^d$ is at each occurrence independently from another selected from the group consisting of hydrogen, deuterium, N(R$^{5s}$)$_2$, OR$^{5s}$, SR$^{5s}$, Si(R$^{5s}$)$_3$, CF$_3$, CN, F, C$_1$-C$_{40}$-alkyl which is optionally substituted with one or more substituents R$^{5s}$ and wherein one or more non-adjacent CH$_2$-groups are optionally substituted by R$^{5s}$C=CR$^{5s}$, C≡C, Si(R$^{5s}$)$_2$, Ge(R$^{5s}$)$_2$, Sn(R$^{5s}$)$_2$, C=O, C=S, C=Se, C=NR$^{5s}$, P(=O)(R$^{5s}$), SO, SO$_2$, NR$^{5s}$, O, S or CONR$^{5s}$;

C$_1$-C$_{40}$-thioalkoxy which is optionally substituted with one or more substituents R$^{5s}$ and wherein one or more non-adjacent CH$_2$-groups are optionally substituted by R$^{5s}$C=CR$^{5s}$, C≡C, Si(R$^{5s}$)$_2$, Ge(R$^{5s}$)$_2$, Sn(R$^{5s}$)$_2$, C=O, C=S, C=Se, C=NR$^{5s}$, P(=O)(R$^{5s}$), SO, SO$_2$, NR$^{5s}$, O, S or CONR$^{5s}$; and C$_6$-C$_{60}$-aryl which is optionally substituted with one or more substituents R$^{5s}$;

C$_3$-C$_{57}$-heteroaryl which is optionally substituted with one or more substituents R$^{5s}$;

wherein the substituents R$^s$, or R$^{5s}$ independently from each other optionally may form a mono- or polycyclic, (hetero)aliphatic, (hetero)aromatic and/or benzo-fused ring system with one or more substituents R$^s$ or R$^{5s}$ and wherein the one or more substituents R$^d$ independently from each other optionally may form a mono- or polycyclic, (hetero)aliphatic, (hetero)aromatic and/or benzo-fused ring system with one or more substituents R$^d$.

16. The organic electroluminescent device according to claim 15, wherein n=2 and X$^s$ is CN.

17. The organic electroluminescent device according to claim 15, wherein R$^s$ is at each occurrence independently from another selected from the group consisting of
hydrogen, deuterium, Me, $^i$Pr, $^t$Bu, CN, CF$_3$,
Ph, which is optionally substituted with one or more substituents independently from each other selected from the group consisting of Me, $^i$Pr, $^t$Bu, CN, CF$_3$ and Ph;
pyridinyl, which is optionally substituted with one or more substituents independently from each other selected from the group consisting of Me, $^i$Pr, $^t$Bu, CN, CF$_3$ and Ph;
pyrimidinyl, which is optionally substituted with one or more substituents independently from each other selected from the group consisting of Me, $^i$Pr, $^t$Bu, CN, CF$_3$ and Ph;
carbazolyl, which is optionally substituted with one or more substituents independently from each other selected from the group consisting of Me, $^i$Pr, $^t$Bu, CN, CF$_3$ and Ph;
triazinyl, which is optionally substituted with one or more substituents independently from each other selected from the group consisting of Me, $^i$Pr, $^t$Bu, CN, CF$_3$ and Ph; and
N(Ph)$_2$.

18. The organic electroluminescent device according to claim 13, wherein the NRCT emitter compound $E^{NRCT}$ consists of a structure according to Formula (In):

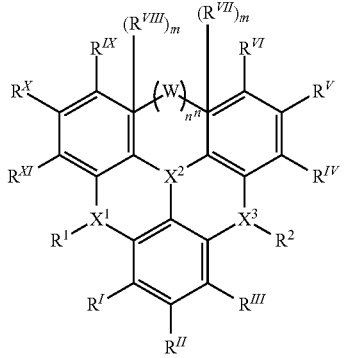

Formula (In)

wherein
n″ is 0 or 1;
m=1−n″;
$X^1$ is N or B;
$X^2$ is N or B;
$X^3$ is N or B;
W is selected from the group consisting of $Si(R^3)_2$, $C(R^3)_2$ and $BR^3$;
each of $R^1$, $R^2$ and $R^3$ is independently from each other selected from the group consisting of:
$C_1$-$C_5$-alkyl, which is optionally substituted with one or more substituents $R^6$;
$C_6$-C60-aryl, which is optionally substituted with one or more substituents $R^6$; and
$C_3$-$C_{57}$-heteroaryl, which is optionally substituted with one or more substituents $R^6$;
each of $R^I$, $R^{II}$, $R^{III}$, $R^{IV}$, $R^V$, $R^{VI}$, $R^{VII}$, $R^{VIII}$, $R^{IX}$, $R^X$, and $R^{XI}$ independently from another selected from the group consisting of:
hydrogen,
deuterium,
$N(R^5)_2$,
$OR^5$,
$Si(R^5)_3$,
$B(OR^5)_2$,
$OSO_2R^5$,
$CF_3$,
CN,
halogen,
$C_1$-$C_{40}$-alkyl,
which is optionally substituted with one or more substituents $R^5$ and
wherein one or more non-adjacent $CH_2$-groups are each optionally substituted by $R^5C=CR^5$, C≡C, $Si(R^5)_2$, $Ge(R^5)_2$, $Sn(R^5)_2$, C=O, C=S, C=Se, C=$NR^5$, P(=O)($R^5$), SO, $SO_2$, $NR^5$, O, S or $CONR^5$,
$C_1$-$C_{40}$-alkoxy,
which is optionally substituted with one or more substituents $R^5$ and
wherein one or more non-adjacent $CH_2$-groups are each optionally substituted by $R^5C=CR^5$, C≡C, $Si(R^5)_2$, $Ge(R^5)_2$, $Sn(R^5)_2$, C=O, C=S, C=Se, C=$NR^5$, P(=O)($R^5$), SO, $SO_2$, $NR^5$, O, S or $CONR^5$;
$C_1$-$C_{40}$-thioalkoxy,
which is optionally substituted with one or more substituents $R^5$ and
wherein one or more non-adjacent $CH_2$-groups are each optionally substituted by $R^5C=CR^5$, C≡C, $Si(R^5)_2$, $Ge(R^5)_2$, $Sn(R^5)_2$, C=O, C=S, C=Se, C=$NR^5$, P(=O)($R^5$), SO, $SO_2$, $NR^5$, O, S or $CONR^5$;
$C_2$-$C_{40}$-alkenyl,
which is optionally substituted with one or more substituents $R^5$ and
wherein one or more non-adjacent $CH_2$-groups are each optionally substituted by $R^5C=CR^5$, C≡C, $Si(R^5)_2$, $Ge(R^5)_2$, $Sn(R^5)_2$, C=O, C=S, C=Se, C=$NR^5$, P(=O)($R^5$), SO, $SO_2$, $NR^5$, O, S or $CONR^5$;
$C_2$-$C_{40}$-alkynyl,
which is optionally substituted with one or more substituents $R^5$ and
wherein one or more non-adjacent $CH_2$-groups are each optionally substituted by $R^5C=CR^5$, C≡C, $Si(R^5)_2$, $Ge(R^5)_2$, $Sn(R^5)_2$, C=O, C=S, C=Se, C=$NR^5$, P(=O)($R^5$), SO, $SO_2$, $NR^5$, O, S or $CONR^5$;
$C_6$-$C_{60}$-aryl,
which is optionally substituted with one or more substituents $R^5$; and $C_3$-$C_{57}$-heteroaryl,
which is optionally substituted with one or more substituents $R^5$;
$R^5$ is at each occurrence independently from another selected from the group consisting of: hydrogen, deuterium, OPh, $CF_3$, CN, F,
wherein optionally one or more hydrogen atoms are independently from each other substituted by deuterium, CN, $CF_3$, or F;
$C_1$-$C_5$-alkoxy,
wherein optionally one or more hydrogen atoms are independently from each other substituted by deuterium, CN, $CF_3$, or F;
$C_1$-$C_5$-thioalkoxy,
wherein optionally one or more hydrogen atoms are independently from each other substituted by deuterium, CN, $CF_3$, or F;
$C_2$-$C_5$-alkenyl,
wherein optionally one or more hydrogen atoms are independently from each other substituted by deuterium, CN, $CF_3$, or F;
$C_2$-$C_5$-alkynyl,
wherein optionally one or more hydrogen atoms are independently from each other substituted by deuterium, CN, $CF_3$, or F;
$C_6$-$C_{18}$-aryl,
which is optionally substituted with one or more $C_1$-$C_5$-alkyl substituents;
$C_3$-$C_{17}$-heteroaryl,
which is optionally substituted with one or more $C_1$-$C_5$-alkyl substituents;
$N(C_6$-$C_{18}$-aryl$)_2$,
$N(C_3$-$C_{17}$-heteroaryl$)_2$; and
$N(C_3$-$C_{17}$-heteroaryl)($C_6$-$C_{18}$-aryl);
$R^6$ is at each occurrence independently from another selected from the group consisting of hydrogen, deuterium, OPh, $CF_3$, CN, F,
$C_1$-$C_5$-alkyl,
wherein optionally one or more hydrogen atoms are independently from each other substituted by deuterium, CN, $CF_3$, or F;
$C_1$-$C_5$-alkoxy,
wherein optionally one or more hydrogen atoms are independently from each other substituted by deuterium, CN, $CF_3$, or F;

$C_1$-$C_5$-thioalkoxy,
   wherein optionally one or more hydrogen atoms are independently from each other substituted by deuterium, CN, $CF_3$, or F;
$C_2$-$C_5$-alkenyl,
   wherein optionally one or more hydrogen atoms are independently from each other substituted by deuterium, CN, $CF_3$, or F;
$C_2$-$C_5$-alkynyl,
   wherein optionally one or more hydrogen atoms are independently from each other substituted by deuterium, CN, $CF_3$, or F;
$C_6$-$C_{18}$-aryl,
   which is optionally substituted with one or more $C_1$-$C_5$-alkyl substituents;
$C_3$-$C_{17}$-heteroaryl,
   which is optionally substituted with one or more $C_1$-$C_5$-alkyl substituents;
$N(C_6$-$C_{18}$-aryl$)_2$,
$N(C_3$-$C_{17}$-heteroaryl$)_2$; and
$N(C_3$-$C_{17}$-heteroaryl)($C_6$-$C_{18}$-aryl);
wherein two or more of the substituents selected from the group consisting of $R^I$, $R^{II}$, $R^{III}$, $R^{IV}$, $R^V$, $R^{VI}$, $R^{VII}$, $R^{VIII}$, $R^{IX}$, $R^X$, and $R^{XI}$ that are positioned adjacent to another may each optionally form a mono- or polycyclic, aliphatic, aromatic and/or benzo-fused ring system with another; and
wherein at least one selected from the group consisting of $X^1$, $X^2$ and $X^3$ is B and at least one selected from the group consisting of $X^1$, $X^2$ and $X^3$ is N.

19. The organic electroluminescent device according to claim 18, wherein $X^1$, and $X^3$ each are N and $X^2$ is B and $n''=0$.

20. The organic compound H according to claim 1, wherein both of $X'_1$ and $X'_2$ are each N.

21. The organic compound H according to claim 1, wherein exactly one of $R_A$, $R_B$, $R_C$, $R_D$ and $R_E$ is —$SiR_KR_MR_N$ and the remaining residues selected from $R_A$, $R_B$, $R_C$, $R_D$ and $R_E$ are each hydrogen.

* * * * *